United States Patent
Hancock et al.

(10) Patent No.: US 9,103,895 B2
(45) Date of Patent: *Aug. 11, 2015

(54) AUTOMATED EMERGENCY POWER SUPPLY TEST USING ENGINE EXHAUST TEMPERATURE

(75) Inventors: Martin A. Hancock, Victoria (CA); Markus F. Hirschbold, Victoria (CA); John Charles Eggink, Brentwood, TN (US); Peter Cowan, Victoria (CA); James M. Taufer, Debary, FL (US); James A. Vun Cannon, Independence, MO (US)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 1145 days.

This patent is subject to a terminal disclaimer.

(21) Appl. No.: 12/917,537

(22) Filed: Nov. 2, 2010

(65) Prior Publication Data

US 2012/0105098 A1    May 3, 2012

(51) Int. Cl.
G01R 31/34    (2006.01)
G01R 31/42    (2006.01)

(52) U.S. Cl.
CPC .............. G01R 31/42 (2013.01); *G01R 31/343* (2013.01)
USPC ........................................................ 702/122

(58) Field of Classification Search
USPC ........................................................ 702/122
See application file for complete search history.

(56) References Cited

U.S. PATENT DOCUMENTS

| | | | |
|---|---|---|---|
| 4,827,152 A | 5/1989 | Farkas |
| 5,458,991 A | 10/1995 | Severinsky |
| 6,698,387 B1 | 3/2004 | McFarland et al. |
| 7,405,553 B1 | 7/2008 | Kattoju |
| 8,407,017 B2 | 3/2013 | Hancock et al. |
| 8,433,531 B2 | 4/2013 | Hancock et al. |

(Continued)

FOREIGN PATENT DOCUMENTS

| | | | |
|---|---|---|---|
| CN | 1267823 A | 9/2000 |
| CN | 1301424 A | 6/2001 |

(Continued)

OTHER PUBLICATIONS

GMX Standard Power Supply, Technical Manual, GMX-915 Models, Effective: May 2007,Alpha Technologies, p. 1-61.*

(Continued)

*Primary Examiner* — Tung S Lau
(74) *Attorney, Agent, or Firm* — Lando & Anastadi LLP

(57) ABSTRACT

An automated emergency power supply system (EPSS) and testing solution that records generator load values and engine exhaust temperature values to evaluate whether an EPSS test satisfies legislated test criteria. The EPSS test is carried out under software control, which initiates a test by instructing an automatic transfer switch (ATS) to change its status to a test status, causing the essential loads to be powered by a generator instead of a main utility power source. Power monitors record the ATS and generator status during the test as well as electrical parameter data from the ATS and generator and exhaust temperature data and other engine parameter data from the generator. When the test is concluded, the ATS is instructed to return the status to normal so that power delivery is resumed from the main power source. The electrical and engine parameter data is analyzed and compared against legislated test criteria to determine a pass/fail result of the EPSS test.

27 Claims, 21 Drawing Sheets

(56) References Cited

U.S. PATENT DOCUMENTS

| | | |
|---|---|---|
| 8,483,982 B2 | 7/2013 | Hancock et al. |
| 2005/0143947 A1 | 6/2005 | James |
| 2010/0250160 A1 | 9/2010 | Spitaels et al. |

FOREIGN PATENT DOCUMENTS

| | | |
|---|---|---|
| CN | 101098078 A | 1/2008 |
| CN | 101737128 A | 6/2010 |
| JP | 2001078371 A | 3/2001 |
| JP | 2005-048631 A | 2/2005 |

OTHER PUBLICATIONS

Automating Emergency Power Supply System Testing in Hospitals, by Markus F. Hirschbold, P. Eng., CEM and Ginni Stieva, Nov. 2010 / White Paper, 16 pages.*

Markus F. Hirschbold, Automating Emergency Power Supply System Testing in Hospitals, Nov. 2010, 16 pages.*

NFPA-110 Standards for Emergency & Stand-by Generators, Jun. 1, 2010, 29 pages.*

Blue Pillar—Avise—Data is collected in real-time, 24-hours a day . . . ; http://www.bluepillar.com/bp_avise_tech_works.html; Downloaded Oct. 5, 2010; (1 Page).

EATON Power Xpert Joint Commission Reporting: http://www.eaton.com/EatonCom/Markets/Electrical/Products/PowerQualityManagement/PowerXpertArchitecture/PowerXpertReporting/index.htm?wtredirect=www.eaton.com/pxr; Downloaded Oct. 5, 2010; (3 Pages).

International Search Report corresponding to co-pending International Patent Application Serial No. PCT/US2011/058092, European Patent Office, dated Nov. 28, 2012; (7 pages).

International Written Opinion corresponding to co-pending International Patent Application Serial No. PCT/US2011/058092, European Patent Office, dated Nov. 28, 2012; (8 pages).

"Be sure you backup power supply system is ready", PowerLogic Emergency Power Supply System, Jan. 1, 2009, XP55044674, Retrieved from the Internet: URL:http://www.powerlogic.com/literature/3000BR0803R309EPSSWebl.pdf [retrieved on Nov. 19, 2012] p. 1-p. 5.

\* cited by examiner

FIG. 11B

AUTOMATED EMERGENCY POWER SUPPLY TEST USING ENGINE EXHAUST TEMPERATURE

FIELD OF THE INVENTION

The present invention relates generally to automated emergency power supply systems.

BACKGROUND OF THE INVENTION

It is not uncommon for back-up generation to fail in the case of an emergency due to insufficient testing and maintenance. In some cases, nominal run tests can actually create problems within the gensets that can affect operation in a true emergency situation (like wet stacking, where unburned fuel or carbon builds up in the exhaust system when the generator run times are too short or the test is performed outside recommended operating parameters).

The challenge is that comprehensive manual tests are difficult to coordinate and it is equally hard to effectively measure results. There are major challenges for multiple stakeholders in the hospital, including medical personnel, facility personnel, and the hospital administration. In short, manual testing of EPS systems is costly and inefficient.

The testing of emergency power supply systems (EPSS) in hospitals, data centers, and other critical buildings plays an essential role to ensure backup power is available when needed. This testing is usually done weekly or monthly and depending on the jurisdiction, different regulatory bodies dictate the parameters of the test. Most commonly, diesel engines are used as prime movers for emergency power supply generators. While diesel engines are known for their reliability and fuel efficiency, it is critical that the testing is carried out within certain limits to make sure that the reliability is increased rather than decreased as a result of the testing.

Traditionally, EPSS testing has been carried out using stop watches and manual recording of test parameters. Manual test procedures are time-consuming and tie up a significant number of personnel. Ignoring actual generator operating temperatures can lead to a wet-stacking condition, in which the presence of unburned fuel or carbon in the exhaust system of a generator can result in black smoke being emitted while the engine is running. Wet-stacking can occur over a prolonged period by running the engine at low loads, allowing the engine to idle during a test, or installing an oversized engine. Eventually, irreversible engine damage can occur.

Improper or incomplete EPSS testing can lead to a significant loss of revenue for a hospital or critical building, or, at worst, to a loss of human life. What is needed is an automated EPSS system that avoids these and other problems.

SUMMARY OF THE INVENTION

Automated EPSS testing increases reliability due to the accurate monitoring and recording of test parameters, it provides traceability in case of unanticipated problems with the EPS system or litigation, and it helps to reduce the staffing burden for such tests, among other advantages. A goal of automated EPSS testing is to increase the overall reliability of the EPS system and to reduce the odds of failure under emergency situations.

Automated testing and monitoring helps identify EPSS problems during testing rather than during emergency situations. By pointing out problem areas during tests, the EPS system's overall mean time between failures (MTBF) can be improved. It is important to ensure that any testing or EPSS operation is performed within the intended operating parameters. This can be achieved by continuously monitoring the EPS system and electronically measuring and recording all relevant automatic transfer switch (ATS), engine-generator (genset) and related parameters, such as transfer times, engine loading, engine temperature, exhaust gas temperature, and oil pressure.

Air and fuel are other important elements for the reliable operation of a facility. It is important to follow a proper maintenance schedule. A system that includes dual redundant fuel lines and filters is a significant benefit in critical applications where long runtimes must be supported. This is so that fuel lines and filters can be isolated and changed while the engine remains running. Proactive monitoring of these filters is done with differential pressure indicators. They show the pressure difference across a filter or between two fuel lines during engine operation. When applied to air filters, these proactive monitoring devices are known as air-restrict indicators. They provide an indication of the need to replace a dry-type intake air filter while the engine is running. Both pressure drop indicators can be electronically monitored by the EPSS test automation system for long term trending and analysis, but also for alarming while the generator is running, for a test or for emergency operation.

Battery health monitoring is another important factor, which can affect the ability for the engine to start. Simply checking the terminal voltage of the batteries is not sufficient to monitor their ability to deliver adequate cranking power. As batteries age, their internal resistance to current flow can increase, and the only reliable test method is to measure the output voltage under load. This test can also be performed by an automated EPSS test system. Having electronic records of the parameters discussed above makes it possible to analyze long-term trends using sophisticated computerized reporting methodologies. For example, a very gradual increase in transfer times (over the period of a year or more) may suggest that maintenance is required. Or, an abnormal drop in battery voltage during engine cranking may indicate that it is time to replace the batteries. Some of these trends may be very subtle and gradual, and often cannot be detected by manual data collection methods.

Also, by continuously monitoring the EPS system, alarms can be triggered if the EPS system is operated outside its intended parameters for prolonged periods of time to avoid reliability threats such as wet stacking, clogged fuel filters or tired batteries. Further, transfer switches and circuit breakers require exercising and mechanical maintenance at regular intervals to assure they operate as intended. Having precise electronic records of the exact times when these devices have been exercised makes it easy to determine when they are due for their next exercising operation.

In the US, for example, hospitals are required to follow NFPA 99 and 110, which prescribe that EPS systems have to be tested at least 12 times a year, every 20 to 40 days, for a minimum of 30 minutes at the manufacturer's recommended exhaust gas temperature or at a minimum load of 30% of the genset's rating. An automated EPSS test solution makes it straightforward to prove conformance to legislative test procedures and requirements.

In Europe, IEC 60364-7-710 prescribes that changeover devices are to be functionally tested every 12 months. Genset combustion engines are to be tested monthly until rated running temperature is achieved with an additional 60-minute annual endurance test. In all cases at least 50% to 100% of the rated power shall be applied. At the same time, hospitals are required to keep precise maintenance and test records for presentation to regulating authorities, or for traceability to determine what happened in the system after improperly functioning or system failure. In the case of system failure, despite proper testing, it is important to have access to detailed electronic data which facilitates sequence of event or cause and effect studies.

According to an aspect of the present disclosure, a method is disclosed for automatically testing an emergency power supply system (EPSS) that supplies alternate power to an electrical system in the event of a disruption of power from a main utility power source that normally supplies power to the electrical system. The method includes: receiving, over the network, engine parameter data associated with an alternate power source. The engine parameter data includes exhaust temperature data indicative of an exhaust temperature of the engine. The alternate power source is configured to supply alternate power to the electrical system in the event of a disruption of power from the main utility power source that normally supplies power to the electrical system. The method further includes instructing, over the network the automatic transfer switch to switch the status from a normal status to a test status to initiate a test of the emergency power supply system by temporarily disconnecting the electrical system from the main utility power source and connecting the electrical system to the alternate power source for a predetermined period of time. The method further includes evaluating a result of the test based on at least the engine parameter data, and responsive to the evaluating, displaying an indication of an outcome of the result of the test.

The method can further include receiving, over a network, operational status information about a change of an operational status of an alternate power source having an engine, which has a nameplate rating; storing the operational status information with a corresponding timestamp indicating when the change of the operational status occurred; receiving, over the network, status information indicating a status of an automatic transfer switch configured to switch power between the main utility power source and the alternate power source. The evaluating the result can be further based on the operational status information and the status information, and wherein the outcome includes a pass or a fail.

The exhaust temperature data can include a plurality of exhaust temperature values measured by a temperature sensor during the test. The result can include the plurality of exhaust temperature values. The evaluating can include determining whether the exhaust temperature values exceed a minimum temperature during at least part of the predetermined period of time of the test. The operational status can include a running status indicating that the engine is running, a started status indicating that the engine is started, or a stopped status indicating that the engine is stopped. The status of the ATS can include the test status, the normal status in which the main utility power source supplies power to the electrical system, or an emergency status in which the alternate power source supplies power to the electrical system.

The evaluating the result can include determining whether the operational status information corresponds to the running status during the predetermined period of time, whether the status information corresponds to the test status indicating that the alternate power source supplied power to the electrical system during the predetermined period of time. The method can further include receiving, over the network, and storing electrical parameter data associated with the alternate power source and measured by an intelligent electronic device that measures a characteristic of power generated by the alternate power source and that transforms the measured characteristic into the electrical parameter data for communication over the network. The evaluating the result can be further based on the stored electrical parameter data.

The evaluating can be further based on a load percentage of the nameplate rating. The load percentage can be calculated from the electrical parameter data during the test. The result can include a plurality of load percentage values calculated from the electrical parameter data during the predetermined period of time. The evaluating can include determining whether the plurality of load percentage values exceed a predetermined load percentage value of the nameplate rating during at least part of the predetermined period of time. The engine parameter data can further include any one or more of a battery voltage of a battery in the alternate power source, a coolant temperature or pressure of the engine, or a differential pressure across a fuel filter of the engine, and wherein the alternate power source is an engine-generator (genset).

Responsive to an occurrence of a loss of power from the main utility power source, the method can further include: storing second electrical parameter data associated with the alternate power source and measured by the intelligent electronic device; and evaluating, based on at least the stored second electrical parameter data during the loss of power from the main utility power source, whether the EPSS would have passed at least one legislated test criterion associated with a test of the EPSS. The evaluating whether the EPSS would have passed at least one legislated test criterion can include determining whether a plurality of load percentage values in the second electrical parameter data exceed the predetermined load percentage value of the nameplate rating during at least part of the predetermined period of time. The legislated test criterion can be determined by a requirement set forth in a code or a standard of the National Fire Protection Association (NFPA), the Health Technical Memorandum (HTM), the Canadian Standards Association (CSA), the Australian/New Zealand Standard (AS/NZS), or the International Electrotechnical Commission (IEC).

Responsive to the occurrence of the loss of power, the method can further include storing second engine parameter data associated with the alternate power source. The second engine parameter data can include any one or more of an exhaust temperature of the engine, a battery voltage of a battery in the alternate power source, a coolant temperature or pressure of the engine, a differential pressure across a fuel filter of the engine, or a waveform associated with an output of the engine. The evaluating whether the EPSS would have passed the legislated test criterion can be further based on the second engine parameter data.

Responsive to the occurrence of the loss of power, the method can further include storing second engine parameter data associated with the engine. The second engine parameter data can include an exhaust temperature of the engine. The evaluating whether the emergency power supply system would have passed the legislated test criterion can be further based on the second engine parameter data.

Responsive to the evaluating determining that the emergency power supply system would have failed the legislated test criterion, the method can further include communicating an alarm indicating that the emergency power supply system would have failed the legislated test criterion and at least one parameter associated with the legislated test criterion that caused the EPSS to fail the legislated test criterion associated with the test of the EPSS.

The electrical system can be a first electrical system of a first installation. The method can further include: responsive to the alternate power source of the first installation supplying power to the first electrical system, receiving, over a network, and storing real-time operational and parameter data associated with the EPS system of the first installation. The operational and parameter data can include electrical parameter data associated with the alternate power source and measured by an intelligent electronic device that measures a characteristic of power generated by the alternate power source and that transforms the measured characteristic into the electrical parameter data for communication over the network. The method can further include: receiving an external operating parameter that is independent from any real-time operational and parameter data associated with the EPS system of the first installation; and automatically generating a report based on at least the external operating parameter.

The external operating parameter can include operational and parameter data associated with a second EPS system of a second installation that is distinct from the first installation. The second installation can include a second alternate power source. The operational and parameter data associated with the second installation can include second electrical parameter data associated with the second alternate power source and measured by a second intelligent electronic device that measures a characteristic of power generated by the second alternate power source and that transforms the measured characteristic into the second electrical parameter data for communication over a network. The automatically generating the report can include benchmarking the operational and parameter data associated with the first installation against the operational and parameter data associated with the second installation. The method can further include displaying a comparison of the benchmarking.

The external operating parameter can include at least two different report criteria associated with different users of the first installation. The automatically generating the report can include: automatically generating a first report based on the report criterion associated with a first of the users of the first installation; and automatically generating a second report based on the report criterion associated with a second of the users of the first installation. The first report and the second report can report different impacts on the first installation.

The method of the first installation can be a hospital. The first user can be a medical care provider. The impact reported by the first report can include an impact on patient safety. The second user can be an administrator or manager of the hospital other than the medical care provider. The impact reported by the second report can include an impact on energy-consumption costs responsive to a passing of the EPS system.

Responsive to the passing of the EPS system, the report can further include a recommendation to shed a load or loads in the first electrical system to generate savings in the energy-consumption costs of the hospital. The impact reported by the second report can include an impact on potential legal liability of the hospital responsive to a failure of the EPS system.

The external operating parameter can include a hypothetical set of operational and parameter data associated with a new alternate power source. The method can further include evaluating the stored operational and parameter data to test a health of the alternate power source to produce a test result indicating the health of the alternate power source. The method can further include determining whether the test result would change if the new alternate power source were installed by evaluating the hypothetical set of operational and parameter data to test the health of the new alternate power source. The method can further include including in the report an indication as to whether changing to the new alternate power source would change the test result. The hypothetical set of operational and parameter data can include a nameplate rating of the new alternate power source and recommended limits specified by a manufacturer of the new alternate power source.

The evaluating the result of the test can include determining, responsive to the instructing, a transfer time associated with switching the power from the main utility power source to the alternate power source based on the received operational status information and the received status information. Any of the methods disclosed herein can be performed by a computing device according to instructions encoded in a computer program stored on a non-transitory tangible medium.

According to another aspect of the present disclosure, a system is disclosed for automatically testing an emergency power supply system (EPSS) that supplies alternate power to an electrical system in the event of a disruption of power from a main utility power source that normally supplies power to the electrical system. The system includes: an alternate power source having an engine and configured to supply alternate power to the electrical system in the event of a disruption of power from the main utility power source that normally supplies power to the electrical system; a network; and a sensor positioned to sense an exhaust temperature of the engine. The system further includes an automatic transfer switch operable to disconnect the electrical system from the main utility power source and to connect the electrical system to the alternate power source. The system further includes a computing device communicatively coupled to the network and configured to receive engine parameter data indicative of the exhaust temperature over the network, instruct, over the network, the automatic transfer switch to switch the status from a normal status to a test status to initiate a test of the emergency power supply system by temporarily disconnecting the electrical system from the main utility power source and connecting the electrical system to the alternate power source for a predetermined period of time. The computing device is further configured to evaluate a result of the test based on the engine parameter data and display an indication of an outcome of the result of the test.

The system can further include an intelligent electronic device that measures a characteristic of power generated by the alternate power source and that transforms the measured characteristic into corresponding electrical parameter data for communication over the network. The computing device can be further configured to receive the electrical parameter data over the network; receive, over the network, status information indicating a status of the automatic transfer switch; and calculate a load percentage of a nameplate rating of the engine from the electrical parameter data during the test. The result of the test can be evaluated based on the load percentage. The outcome can include a pass or a fail.

According to yet another aspect of the present disclosure, a computer program product is disclosed. The computer product includes one or more non-transitory tangible media having a computer readable program logic embodied therein. The computer readable program logic is configured to be executed to implement a method for automatically testing an emergency power supply system (EPSS) that supplies alternate power to an electrical system in the event of a disruption of power from a main utility power source that normally supplies power to the electrical system. The method includes receiving, over the network, engine parameter data associated with an alternate power source. The engine parameter data includes exhaust temperature data indicative of an exhaust temperature of the engine. The alternate power source is configured to supply alternate power to the electrical system in the event of a disruption of power from the main utility power source that normally supplies power to the electrical system. The method further includes instructing, over the network, the automatic transfer switch to switch the status from a normal status to a test status to initiate a test of the emergency power supply system by temporarily disconnecting the electrical system from the main utility power source and connecting the electrical system to the alternate power source for a predetermined period of time. The method further includes evaluating a result of the test based on at least the engine parameter data, and responsive to the evaluating, displaying an indication of an outcome of the result of the test.

According to another aspect of the present disclosure, a method is disclosed for automatically testing an emergency power supply system (EPSS) that supplies alternate power to an electrical system in the event of a disruption of power from a main utility power source that normally supplies power to the electrical system. The method includes receiving, over the network, and storing electrical parameter data associated with an alternate power source and measured by an intelligent electronic device that measures a characteristic of power generated by the alternate power source and that transforms the measured characteristic into the electrical parameter data for communication over the network, the alternate power source being configured to supply alternate power to the electrical system in the event of a disruption of power from the main utility power source that normally supplies power to the electrical system. The method includes receiving, over the network, engine parameter data associated with an engine of the alternate power source, and receiving a test parameter selection indicating one or more parameters to be used in testing the emergency power supply system. The method includes instructing, over the network, an automatic transfer switch to switch from a normal mode to a test mode to initiate a test of the emergency power supply system by temporarily disconnecting the electrical system from the main utility power source and connecting the electrical system to the alternate power source for a predetermined period of time. Responsive to the test parameter selection indicating that the electrical parameter data is to be used in testing the emergency power supply system, the method includes evaluating a result of the test based on at least the electrical parameter data including determining a percentage of a load of the electrical system relative to the nameplate rating of the engine. Responsive to the test parameter selection indicating that the engine parameter data is to be used in testing the emergency power supply system, the method includes evaluating a result of the test based on at least the engine parameter data, and, responsive to the evaluating, displaying an indication of an outcome of the result of the test.

Responsive to the test parameter selection indicating that the electrical parameter data and the engine parameter data are to be used in testing the emergency power supply system, the method can further include evaluating a result of the test based on at least the electrical parameter data and the engine parameter data. The result of the test can include a pass indicating that at a legislated test criterion associated with the test of the EPSS is satisfied and a fail indicating that the legislated test criterion is not satisfied. The legislated test criterion can be determined by a requirement set forth in a code or a standard of the National Fire Protection Association (NFPA), the Health Technical Memorandum (HTM), the Canadian Standards Association (CSA), the Australian/New Zealand Standard (AS/NZS), or the International Electrotechnical Commission (IEC). The engine parameter data can further include any one or more of an exhaust temperature of the engine, a battery voltage of a battery in the alternate power source, a coolant temperature or pressure of the engine, or a differential pressure across a fuel filter of the engine. The alternate power source can be an engine-generator (genset).

The method can include receiving, over a network, operational status information about a change of an operational status of the alternate power source. The method can include storing the operational status information with a corresponding timestamp indicating when the change of the operational status occurred. The method can include receiving, over the network, status information indicating a status of the automatic transfer switch configured to switch power between the main utility power source and the alternate power source. The evaluating the result of the test can include determining, responsive to the instructing, a transfer time associated with switching the power from the main utility power source to the alternate power source based on the received operational status information and the received status information.

Responsive to an occurrence of a loss of power from the main utility power source, the method can further include: storing second electrical parameter data associated with the alternate power source and measured by the intelligent electronic device during the loss of power; and evaluating, based on at least the stored second electrical parameter data during the loss of power from the main utility power source, whether the EPSS would have passed at least one legislated test criterion associated with the test of the EPSS. Responsive to the occurrence of the loss of power, the method can further include storing second engine parameter data associated with the alternate power source. The second engine parameter data can include any one or more of an exhaust temperature of the engine, a battery voltage of a battery in the alternate power source, a coolant temperature or pressure of the engine, a differential pressure across a fuel filter of the engine, or a waveform associated with an output of the engine. The evaluating whether the EPSS would have passed the legislated test criterion can be further based on the second engine parameter data.

Responsive to the occurrence of the loss of power, the method can further include storing second engine parameter data associated with the engine. The second engine parameter data can include an exhaust temperature of the engine. The evaluating whether the emergency power supply system would have passed the legislated test criterion can be further based on the second engine parameter data. Responsive to the evaluating determining that the emergency power supply system would have failed the legislated test criterion, the method can further include communicating an alarm indicating that the emergency power supply system would have failed the legislated test criterion and at least one parameter associated with the legislated test criterion that caused the EPSS to fail the legislated test criterion associated with the test of the EPSS.

The electrical system can be a first electrical system of a first installation. The method can further include, responsive to the alternate power source of the first installation supplying power to the first electrical system, receiving, over a network, and storing real-time operational and parameter data associated with the EPS system of the first installation. The operational and parameter data can include electrical parameter data associated with the alternate power source and measured by an intelligent electronic device that measures a characteristic of power generated by the alternate power source and that transforms the measured characteristic into the electrical parameter data for communication over the network. The method can further include receiving an external operating parameter that is independent from any real-time operational and parameter data associated with the EPS system of the first installation, and automatically generating a report based on at least the external operating parameter.

The external operating parameter can include operational and parameter data associated with a second EPS system of a second installation that is distinct from the first installation, the second installation having a second alternate power source. The operational and parameter data associated with the second installation can include second electrical parameter data associated with the second alternate power source and measured by a second intelligent electronic device that measures a characteristic of power generated by the second alternate power source and that transforms the measured characteristic into the second electrical parameter data for communication over a network. The automatically generating the report can include benchmarking the operational and parameter data associated with the first installation against the operational and parameter data associated with the second installation. The method can further include displaying a comparison of the benchmarking.

The external operating parameter can include at least two different report criteria associated with different users of the first installation. The automatically generating the report can include automatically generating a first report based on the report criterion associated with a first of the users of the first installation, and automatically generating a second report based on the report criterion associated with a second of the users of the first installation. The first report and the second report can report different impacts on the first installation.

The first installation can be a hospital. The first user can be a medical care provider. The impact reported by the first report can include an impact on patient safety. The second user can include an administrator or manager of the hospital other than the medical care provider. The impact reported by the second report can include an impact on energy-consumption costs responsive to a passing of the EPS system.

Responsive to the passing of the EPS system, the report can further include a recommendation to shed a load or loads in the first electrical system to generate savings in the energy-consumption costs of the hospital. The impact reported by the second report can include an impact on potential legal liability of the hospital responsive to a failure of the EPS system.

The external operating parameter can include a hypothetical set of operational and parameter data associated with a new alternate power source. The method can further include evaluating the stored operational and parameter data to test a health of the alternate power source to produce a test result indicating the health of the alternate power source. The method can further include: determining whether the test result would change if the new alternate power source were installed by evaluating the hypothetical set of operational and parameter data to test the health of the new alternate power source; and including in the report an indication as to whether changing to the new alternate power source would change the test result. The hypothetical set of operational and parameter data can include a nameplate rating of the new alternate power source and recommended limits specified by a manufacturer of the new alternate power source.

According to a still further aspect of the present disclosure, a system is provided for automatically testing an emergency power supply system (EPSS) that supplies alternate power to an electrical system in the event of a disruption of power from a main utility power source that normally supplies power to the electrical system. The system includes an alternate power source having an engine and configured to supply alternate power to the electrical system in the event of a disruption of power from the main utility power source that normally supplies power to the electrical system. The system further includes a network and an intelligent electronic device that measures a characteristic of power generated by the alternate power source and that transforms the measured characteristic into corresponding electrical parameter data for communication over the network. The system further includes an automatic transfer switch operable to switch power delivered to the electrical system between the main utility power source and the alternate power source. The system further includes a computing device communicatively coupled to the network and configured to: receive a test parameter selection indicating one or more parameters to be used in testing the emergency power supply system; receive (a) engine parameter data associated with the engine and (b) the electrical parameter data over the network; instruct, over the network, the automatic transfer switch to switch the status from a normal status to a test status to initiate a test of the emergency power supply system by temporarily disconnecting the electrical system from the main utility power source and connecting the electrical system to the alternate power source for a predetermined period of time; determine whether the test parameter selection indicates that the electrical parameter data is to be used in testing the EPSS, and if so, evaluate a result of the test based on the electrical parameter data by determining a percentage of a load of the electrical system relative to a nameplate rating of the engine; determine whether the test parameter selection indicates that the engine parameter data is to be used in testing the EPSS, and if so, evaluate a result of the test based on the engine parameter data; and display an indication of an outcome of the result of the test.

The computing device can be further configured to determine whether the test parameter selection indicates that the electrical parameter data and the engine parameter data are to be used in testing the EPSS, and if so, evaluate a result of the test based on the electrical parameter data and the engine parameter data. The result of the test can include a pass indicating that at a legislated test criterion associated with the test of the EPSS is satisfied and a fail indicating that the legislated test criterion is not satisfied. The legislated test criterion can be determined by a requirement set forth in a code or a standard of the National Fire Protection Association (NFPA), the Health Technical Memorandum (HTM), the Canadian Standards Association (CSA), the Australian/New Zealand Standard (AS/NZS), or the International Electrotechnical Commission (IEC). The engine parameter data can further include any one or more of an exhaust temperature of the engine, a battery voltage of a battery in the alternate power source, a coolant temperature or pressure of the engine, or a differential pressure across a fuel filter of the engine, and the alternate power source is an engine-generator (genset).

The computing device can be further configured to determine whether a loss of power from the main utility power source has occurred, and if so, store second electrical parameter data associated with the alternate power source and measured by the intelligent electronic device during the loss of power and evaluate, based on the second electrical parameter data stored during the loss of power, whether the EPSS would have passed a legislated test criterion associated with the test of the EPSS.

According to yet another aspect of the present disclosure, a computer program product is provided that includes one or more non-transitory tangible media having a computer readable program logic embodied therein, The computer readable program logic is configured to be executed to implement a method for automatically testing an emergency power supply system (EPSS) that supplies alternate power to an electrical system in the event of a disruption of power from a main utility power source that normally supplies power to the electrical system. The implemented method includes receiving, over the network, and storing electrical parameter data associated with an alternate power source and measured by an intelligent electronic device that measures a characteristic of power generated by the alternate power source and that transforms the measured characteristic into the electrical parameter data. The alternate power source can be configured to supply alternate power to the electrical system in the event of a disruption of power from the main utility power source that normally supplies power to the electrical system. The method further includes receiving, over the network, engine parameter data associated with an engine of the alternate power source, receiving a test parameter selection indicating one or more parameters to be used in testing the emergency power supply system. The method further includes instructing, over the network, an automatic transfer switch to switch from a normal mode to a test mode to initiate a test of the emergency power supply system by temporarily disconnecting the electrical system from the main utility power source and connecting the electrical system to the alternate power source for a predetermined period of time. Responsive to the test parameter selection indicating that the electrical parameter data is to be used in testing the emergency power supply system, the method further includes evaluating a result of the test based on at least the electrical parameter data. Responsive to the test parameter selection indicating that the engine parameter data is to be used in testing the emergency power supply system, the method further includes evaluating a result of the test based on at least the engine parameter data. Responsive to the evaluating, the method includes displaying an indication of an outcome of the result of the test.

According to another aspect of the present disclosure, a method is provided for automatically evaluating an emergency power supply system (EPSS) that supplies alternate power to an electrical system in the event of a disruption of power from a main utility power source that normally supplies power to the electrical system. The method includes receiving, over a network, operational status information about a change of an operational status of an alternate power source configured to supply alternate power to the electrical system in the event of a disruption of power from the main utility power source that normally supplies power to the electrical system. The method further includes storing the operational status information with a corresponding timestamp indicating when the change of the operational status occurred. The method further includes receiving, over the network, and storing electrical parameter data associated with the alternate power source and measured by an intelligent electronic device that measures a characteristic of power generated by the alternate power source and that transforms the measured characteristic into the electrical parameter data for communication over the network. The method further includes receiving, over the network, status information indicating a status of an automatic transfer switch configured to switch power between the main utility power source and the alternate power source. The method further includes measuring, based on the received operational status information and the received status information, a transfer time corresponding to the amount of time that elapsed for the automatic transfer switch to switch from a normal status to a test status or an emergency status. The method further includes determining a priority level from among a plurality of priority levels associated with the electrical system undergoing a test of the EPSS, associating each of the priority levels with a corresponding one of a plurality of predetermined transfer times, each of the predetermined transfer times differing from one another. The method includes determining whether the measured transfer time exceeded the predetermined transfer time associated with the determined priority level; and responsive to the measured transfer time exceeding the predetermined transfer time associated with the determined priority level, displaying an alarm indicating that the measured transfer time exceeds the predetermined transfer time.

The priority levels can include a low priority level associated with non-critical electrical equipment in a hospital powered by the electrical system, a medium priority level associated with safety electrical equipment in the hospital, and a high priority level associated with critical electrical equipment in the hospital. The alternate power source can include an engine having a nameplate rating. The method can further include receiving, over the network, engine parameter data associated with the alternate power source. The engine parameter data can include exhaust temperature data indicative of an exhaust temperature of the engine. The method can include instructing, over the network, the automatic transfer switch to switch the status from a normal status to a test status to initiate a test of the emergency power supply system by temporarily connecting the electrical system to the alternate power source for a predetermined period of time. The method can include evaluating a result of the test based on at least the engine parameter data; and responsive to the evaluating, displaying an indication of an outcome of the result of the test. The method of the alternate power source can be an engine-generator (genset).

Responsive to an occurrence of a loss of power from the main utility power source, the method can further include storing second electrical parameter data associated with the alternate power source and measured by the intelligent electronic device during the loss of power; and evaluating, based on at least the stored second electrical parameter data during the loss of power from the main utility power source, whether the EPSS would have passed at least one legislated test criterion associated with the test of the EPSS. Responsive to the occurrence of the loss of power, the method can further include storing second engine parameter data associated with the alternate power source. The second engine parameter data includes any one or more of an exhaust temperature of the engine, a battery voltage of a battery in the alternate power source, a coolant temperature or pressure of the engine, a differential pressure across a fuel filter of the engine, or a waveform associated with an output of the engine. The evaluating whether the EPSS would have passed the legislated test criterion can be further based on the second engine parameter data.

Responsive to the occurrence of the loss of power, the method can further include storing second engine parameter data associated with the engine. The second engine parameter data can include an exhaust temperature of the engine. The evaluating whether the emergency power supply system would have passed the legislated test criterion can be further based on the exhaust temperature of the second engine parameter data. Responsive to the evaluating determining that the emergency power supply system would have failed the legislated test criterion, the method can further include communicating an alarm indicating that the emergency power supply system would have failed the legislated test criterion and at least one parameter associated with the legislated test criterion that caused the EPSS to fail the legislated test criterion associated with the test of the EPSS.

The electrical system can be a first electrical system of a first installation. Responsive to the alternate power source of the first installation supplying power to the first electrical system, the method can further include receiving, over a network, and storing real-time operational and parameter data associated with the EPS system of the first installation. The operational and parameter data can include the electrical parameter data measured by the intelligent electronic device. The method can further include receiving an external operating parameter that is independent from any real-time operational and parameter data associated with the EPS system of the first installation; and automatically generating a report based on at least the external operating parameter.

The external operating parameter can include operational and parameter data associated with a second EPS system of a second installation that is distinct from the first installation. The second installation can have a second alternate power source. The operational and parameter data associated with the second installation can include second electrical parameter data associated with the second alternate power source and measured by a second intelligent electronic device that measures a characteristic of power generated by the second alternate power source and that transforms the measured characteristic into the second electrical parameter data for communication over a network. The automatically generating the report can include benchmarking the operational and parameter data associated with the first installation against the operational and parameter data associated with the second installation. The method can further include displaying a comparison of the benchmarking.

The external operating parameter can include at least two different report criteria associated with different users of the first installation. The automatically generating the report can include automatically generating a first report based on the report criterion associated with a first of the users of the first installation. The method can further include automatically generating a second report based on the report criterion associated with a second of the users of the first installation. The first report and the second report can report different impacts on the first installation.

The first installation can be a hospital. The first user can include a medical care provider. The impact reported by the first report can include an impact on patient safety. The second user can include an administrator or manager of the hospital other than the medical care provider. The impact reported by the second report can include an impact on energy-consumption costs responsive to a passing of the EPS system. Responsive to the passing of the EPS system, the report can further include a recommendation to shed a load or loads in the first electrical system to generate savings in the energy-consumption costs of the hospital. The impact reported by the second report can include an impact on potential legal liability of the hospital responsive to a failure of the EPS system.

The external operating parameter can include a hypothetical set of operational and parameter data associated with a new alternate power source. The method can further include evaluating the stored operational and parameter data to test a health of the alternate power source to produce a test result indicating the health of the alternate power source. The method can further include determining whether the test result would change if the new alternate power source were installed by evaluating the hypothetical set of operational and parameter data to test the health of the new alternate power source. The method can further include in the report an indication as to whether changing to the new alternate power source would change the test result. The hypothetical set of operational and parameter data can include a nameplate rating of the new alternate power source and recommended limits specified by a manufacturer of the new alternate power source.

According to a further aspect of the present disclosure, a system is provided for automatically testing an emergency power supply system (EPSS) that supplies alternate power to an electrical system in the event of a disruption of power from a main utility power source that normally supplies power to the electrical system. The system includes an alternate power source having an engine and configured to supply alternate power to the electrical system in the event of a disruption of power from the main utility power source that normally supplies power to the electrical system. The system includes a network and an intelligent electronic device that measures a characteristic of power generated by the alternate power source and that transforms the measured characteristic into corresponding electrical parameter data for communication over the network. The system includes an automatic transfer switch operable to disconnect the electrical system from the main utility power source and to connect the electrical system to the alternate power source. The system includes a computing device communicatively coupled to the network and configured to receive the engine parameter data and the electrical parameter data over the network. The computing device is further configured to receive, over the network, operational status information about a change of an operational status of the alternate power source and cause the operational status information with a corresponding timestamp to be stored. The computing device is further configured to receive, over the network, status information indicating a status of the automatic transfer switch. The computing device is further configured to instruct, over the network, the automatic transfer switch to switch the status from a normal status to a test status to initiate a test of the emergency power supply system by temporarily disconnecting the electrical system from the main utility power source and connecting the electrical system to the alternate power source for a predetermined period of time. The computing device is further configured to measure, based on the operational status information and the status information, a transfer time corresponding to the amount of time that elapsed for the automatic transfer switch to switch from a normal status to a test status or an emergency status. The computing device is further configured to determine a priority level from among a plurality of priority levels associated with the electrical system undergoing the test; associate each of the priority levels with a corresponding one of a plurality of distinct, predetermined transfer times; determine whether the measured transfer time exceeded the predetermined transfer time associated with the determined priority level; and, responsive to the measured transfer time exceeding the predetermined transfer time associated with the determined priority level, causing an alarm indicating that the measured transfer time exceeds the predetermined transfer time to be displayed.

The priority levels can include a low priority level associated with non-critical electrical equipment in a hospital powered by the electrical system, a medium priority level associated with safety electrical equipment in the hospital, and a high priority level associated with critical electrical equipment in the hospital. The alternate power source can be an engine-generator (genset).

The system can further include a temperature sensor positioned to measure an exhaust temperature of the engine. The temperature sensor can produce corresponding engine parameter data indicative of the measured exhaust temperature. The computing device can be further configured to evaluate a result of the test based on the engine parameter data; and to cause an indication of an outcome of the result of the test to be displayed.

The computing device can be further configured to determine whether a loss of power from the main utility power source has occurred, and if so, store second electrical parameter data associated with the alternate power source and measured by the intelligent electronic device during the loss of power and evaluate, based on the second electrical parameter data stored during the loss of power, whether the EPSS would have passed a legislated test criterion associated with the test of the EPSS.

According to yet another aspect of the present disclosure, a computer program product is disclosed, which includes one or more non-transitory tangible media having a computer readable program logic embodied therein. The computer readable program logic is configured to be executed to implement a method for automatically evaluating an emergency power supply system (EPSS) that supplies alternate power to an electrical system in the event of a disruption of power from a main utility power source that normally supplies power to the electrical system. The method includes receiving, over a network, operational status information about a change of an operational status of an alternate power source configured to supply alternate power to the electrical system in the event of a disruption of power from the main utility power source that normally supplies power to the electrical system. The method includes storing the operational status information with a corresponding timestamp indicating when the change of the operational status occurred. The method includes receiving, over the network, and storing electrical parameter data associated with the alternate power source and measured by an intelligent electronic device that measures a characteristic of power generated by the alternate power source and that transforms the measured characteristic into the electrical parameter data for communication over the network. The method includes receiving, over the network, status information indicating a status of an automatic transfer switch configured to switch power between the main utility power source and the alternate power source. The method includes measuring, based on the received operational status information and the received status information, a transfer time corresponding to the amount of time that elapsed for the automatic transfer switch to switch from a normal status to a test status or an emergency status. The method includes determining a priority level from among a plurality of priority levels associated with the electrical system undergoing a test of the EPSS. The method includes associating each of the priority levels with a corresponding one of a plurality of predetermined transfer times, each of the predetermined transfer times differing from one another. The method includes determining whether the measured transfer time exceeded the predetermined transfer time associated with the determined priority level; and responsive to the measured transfer time exceeding the predetermined transfer time associated with the determined priority level, displaying an alarm indicating that the measured transfer time exceeds the predetermined transfer time.

According to a further aspect of the present disclosure a method is provided for automatically testing an emergency power supply system (EPSS) that supplies alternate power to an electrical system in the event of a disruption of power from a main utility power source that normally supplies power to the electrical system. The method includes receiving, over the network, and storing electrical parameter data associated with an alternate power source of the EPSS and measured by an intelligent electronic device that measures a characteristic of power generated by the alternate power source and that transforms the measured characteristic into the electrical parameter data for communication over the network. The method includes receiving a first indication of a first amount of a load of a variable load bank to consume energy produced by the alternate power source. The method includes instructing, over the network, the automatic transfer switch to switch the status from a normal status to a test status to initiate a first test of the emergency power supply system by temporarily connecting the first load amount of the variable load bank to the alternate power source for a predetermined period of time. The method includes evaluating a first result of the first test based on at least the electrical parameter data received during the first test; responsive to the evaluating, displaying an indication of the first result of the first test; and receiving a second indication of a second load amount of the load of the variable load bank. The method includes instructing the automatic transfer switch to switch the status from the normal status to the test status to initiate a second test of the emergency power supply system by temporarily connecting the second load amount of the variable load bank to the alternate power source, evaluating a second result of the second test based on at least the electrical parameter data received during the second test; and responsive to the evaluating, displaying an indication of the second result of the second test.

The alternate power source can be configured to supply alternate power to the electrical system in the event of a disruption of power from the main utility power source that normally supplies power to the electrical system. The alternate power source can be an engine-generator (genset) that includes an engine having a nameplate rating. The method can further include receiving, over the network, engine parameter data associated with the alternate power source. The engine parameter data can include exhaust temperature data indicative of an exhaust temperature of the engine. The evaluating the first result or the evaluating the second result can be based further on the exhaust temperature data. The first indication and the second indication can be represented as a percentage of a maximum load of the variable load bank. The EPSS can be installed in a datacenter.

The method can further include receiving, over a network, operational status information about a change of an operational status of an alternate power source, storing the operational status information with a corresponding timestamp indicating when the change of the operational status occurred; and receiving, over the network, status information indicating a status of an automatic transfer switch configured to switch power between the main utility power source and the alternate power source. The method can further include evaluating the first result includes determining, responsive to the instructing, a transfer time associated with switching the power from the main utility power source to the alternate power source during the first test based on the operational status information and the status information received during the first test. The evaluating the second result can include determining, responsive to the instructing, a second transfer time associated with switching the power from the main utility power source to the alternate power source during the second test based on the operational status information and the status information received during the second test.

Responsive to an occurrence of a loss of power from the main utility power source, the method can further include: storing second electrical parameter data associated with the alternate power source and measured by the intelligent electronic device during the loss of power; and evaluating, based on at least the stored second electrical parameter data during the loss of power from the main utility power source, whether the EPSS would have passed at least one legislated test criterion associated with the test of the EPSS.

Responsive to the occurrence of the loss of power, the method can further include storing second engine parameter data associated with the alternate power source. The second engine parameter data can include any one or more of an exhaust temperature of the engine, a battery voltage of a battery in the alternate power source, a coolant temperature or pressure of the engine, a differential pressure across a fuel filter of the engine, or a waveform associated with an output of the engine. The evaluating whether the EPSS would have passed the legislated test criterion can be further based on the second engine parameter data.

Responsive to the occurrence of the loss of power, the method can further include storing second engine parameter data associated with the engine. The second engine parameter data can include an exhaust temperature of the engine. The evaluating whether the emergency power supply system would have passed the legislated test criterion can be further based on the exhaust temperature of the second engine parameter data. Responsive to the evaluating determining that the emergency power supply system would have failed the legislated test criterion, the method can further include communicating an alarm indicating that the emergency power supply system would have failed the legislated test criterion and at least one parameter associated with the legislated test criterion that caused the EPSS to fail the legislated test criterion associated with the test of the EPSS.

The electrical system can be a first electrical system of a first installation. Responsive to the alternate power source of the first installation supplying power to the first electrical system, the method can further include receiving, over a network, and storing real-time operational and parameter data associated with the EPS system of the first installation. The operational and parameter data can include the electrical parameter data measured by the intelligent electronic device. The method can further include: receiving an external operating parameter that is independent from any real-time operational and parameter data associated with the EPS system of the first installation; and automatically generating a report based on at least the external operating parameter.

The external operating parameter can include operational and parameter data associated with a second EPS system of a second installation that is distinct from the first installation. The second installation can have a second alternate power source. The operational and parameter data associated with the second installation can include second electrical parameter data associated with the second alternate power source and measured by a second intelligent electronic device that measures a characteristic of power generated by the second alternate power source and that transforms the measured characteristic into the second electrical parameter data for communication over a network. The automatically generating the report can include benchmarking the operational and parameter data associated with the first installation against the operational and parameter data associated with the second installation. The method can further include displaying a comparison of the benchmarking.

The operational and parameter data associated with the first installation can further include (a) operational status information about a change of an operational status of the alternate power source of the first installation, and (b) status information indicating a status of an automatic transfer switch configured to switch power between the main utility power source and the alternate power source of the first installation. The operational and parameter data associated with the second installation can further include (a) operational status information about a change of an operational status of the alternate power source of the second installation, and (b) status information indicating a status of an automatic transfer switch configured to switch power between the main utility power source and the alternate power source of the second installation. The benchmarking can include comparing a transfer time calculated based on the operational status information and the status information associated with the first installation with a second transfer time calculated based on the operational status information and the status information associated with the second installation.

The external operating parameter can include at least two different report criteria associated with different users of the first installation. The automatically generating the report can include: automatically generating a first report based on the report criterion associated with a first of the users of the first installation; and automatically generating a second report based on the report criterion associated with a second of the users of the first installation. The first report and the second report can report different impacts on the first installation.

The first installation can be a hospital. The first user can include a medical care provider. The impact reported by the first report can include an impact on patient safety. The second user can include an administrator or manager of the hospital other than the medical care provider. The impact reported by the second report can include an impact on energy-consumption costs responsive to a passing of the EPS system. Responsive to the passing of the EPS system, the report can further include a recommendation to shed a load or loads in the first electrical system to generate savings in the energy-consumption costs of the hospital. The method of the impact reported by the second report can include an impact on potential legal liability of the hospital responsive to a failure of the EPS system.

The external operating parameter can include a hypothetical set of operational and parameter data associated with a new alternate power source. The method can further include evaluating the stored operational and parameter data to test a health of the alternate power source to produce a test result indicating the health of the alternate power source. The method can further include: determining whether the test result would change if the new alternate power source were installed by evaluating the hypothetical set of operational and parameter data to test the health of the new alternate power source; and including in the report an indication as to whether changing to the new alternate power source would change the test result. The hypothetical set of operational and parameter data can include a nameplate rating of the new alternate power source and recommended limits specified by a manufacturer of the new alternate power source.

According to yet a further aspect of the present disclosure, a system is provided for automatically testing an emergency power supply system (EPSS) that supplies alternate power to an electrical system in the event of a disruption of power from a main utility power source that normally supplies power to the electrical system. The system includes an alternate power source configured to supply alternate power to the electrical system in the event of a disruption of power from the main utility power source that normally supplies power to the electrical system; a network; an intelligent electronic device that measures a characteristic of power generated by the alternate power source and that transforms the measured characteristic into corresponding electrical parameter data for communication over the network; a variable load bank coupled to the alternate power source that consumes energy produced by the alternate power source; an automatic transfer switch operable to disconnect the electrical system from the main utility power source and to connect the electrical system to the alternate power source; and a computing device communicatively coupled to the network and configured to receive the electrical parameter data over the network. The computing device is further configured to receive, over the network, operational status information about a change of an operational status of the alternate power source and cause the operational status information with a corresponding timestamp to be stored. The computing device is further configured to receive a first indication of a first amount of a load of the variable load bank to consume energy produced by the alternate power source. The computing device is further configured to instruct, over the network, the automatic transfer switch to switch the status from a normal status to a test status to initiate a first test of the EPSS by temporarily connecting the first load amount of the variable load bank to the alternate power source for a predetermined period of time while disconnecting the main utility power source from the electrical system. The computing device is further configured to evaluate a first result of the first test based on the electrical parameter data received during the first test and cause an indication of the first result to be displayed. The computing device is further configured to receive a second indication of a second amount of a load of the variable load bank. The computing device is further configured to instruct, over the network, the automatic transfer switch to switch the status from the normal status to the test status to initiate a second test of the EPSS by temporarily connecting the second load amount of the variable load bank to the alternate power source while disconnecting the main utility power source from the electrical system. The computing device is further configured to evaluate a second result of the second test based on the electrical parameter data received during the second test and cause an indication of the second result of the second test to be displayed. The EPSS can be installed in a datacenter.

According to yet another aspect of the present disclosure, a computer program product is provided, which includes one or more non-transitory tangible media having a computer readable program logic embodied therein. The computer readable program logic is configured to be executed to implement a method for automatically testing an emergency power supply system (EPSS) that supplies alternate power to an electrical system in the event of a disruption of power from a main utility power source that normally supplies power to the electrical system. The implemented method includes receiving, over the network, and storing electrical parameter data associated with an alternate power source of the EPSS and measured by an intelligent electronic device that measures a characteristic of power generated by the alternate power source and that transforms the measured characteristic into the electrical parameter data for communication over the network, the alternate power source being configured to supply alternate power to the electrical system in the event of a disruption of power from the main utility power source that normally supplies power to the electrical system. The method includes receiving a first indication of a first amount of a load of a variable load bank to consume energy produced by the alternate power source. The method includes instructing, over the network, the automatic transfer switch to switch the status from a normal status to a test status to initiate a first test of the emergency power supply system by temporarily connecting the first load amount of the variable load bank to the alternate power source for a predetermined period of time. The method includes evaluating a first result of the first test based on at least the electrical parameter data received during the first test; responsive to the evaluating, displaying an indication of the first result of the first test; receiving a second indication of a second load amount of the load of the variable load bank; instructing the automatic transfer switch to switch the status from the normal status to the test status to initiate a second test of the emergency power supply system by temporarily connecting the second load amount of the variable load bank to the alternate power source; evaluating a second result of the second test based on at least the electrical parameter data received during the second test; and responsive to the evaluating, displaying an indication of the second result of the second test.

According to yet a further aspect of the present disclosure, a method is provided for automatically evaluating an emergency power supply (EPS) system that supplies alternate power to an electrical system in the event of a disruption of power from a main utility power source that normally supplies power to the electrical system. The method includes, responsive to each of multiple occurrences that the power supplied to the electrical system is switched by an automatic transfer switch from the main utility power source to the alternate power source: receiving, over a network, and storing a set of operational and parameter data associated with the EPS system of the electrical system during each of the occurrences to produce a plurality of sets of operational and parameter data; evaluating the sets of operational and parameter data to identify at least one characteristic of the alternate power source that is deteriorating over an evaluation time period that includes the time period between the first of the occurrences and a most recent one of the occurrences; assigning a failure priority to the deteriorating characteristic; and automatically generating a report that indicates the failure priority and the deteriorating characteristic. The operational and parameter data includes (a) operational status information about a change of an operational status of the alternate power source, (b) electrical parameter data associated with the alternate power source and measured by an intelligent electronic device that measures a characteristic of power generated by the alternate power source and that transforms the measured characteristic into the electrical parameter data for communication over the network, and (c) status information indicating a status of an automatic transfer switch configured to switch power between the main utility power source and the alternate power source.

The failure priority can include a non-critical priority and a critical priority. The characteristic can be a transfer time representing a time period that elapses between a start time when an instruction communicated to the automatic transfer switch and an end time when the automatic transfer switch switches power from the main utility power source to the alternate power source. The transfer time can be deteriorating over time by trending upwards. The failure priority can be assigned to the non-critical priority. A rate of change of the characteristic over the evaluation time period can exceed a predetermined value such that the deterioration of the characteristic appears to spike over the evaluation time period. The failure priority can be assigned to the critical priority. The alternate power source can be an engine-generator (genset).

Responsive to an occurrence of a loss of power from the main utility power source, the method can further include: storing second electrical parameter data associated with the alternate power source and measured by the intelligent electronic device during the loss of power; and evaluating, based on at least the stored second electrical parameter data during the loss of power from the main utility power source, whether the EPSS would have passed at least one legislated test criterion associated with the test of the EPSS. Responsive to the occurrence of the loss of power, the method can further include storing second engine parameter data associated with the alternate power source. The second engine parameter data can include any one or more of an exhaust temperature of the engine, a battery voltage of a battery in the alternate power source, a coolant temperature or pressure of the engine, a differential pressure across a fuel filter of the engine, or a waveform associated with an output of the engine. The evaluating whether the EPSS would have passed the legislated test criterion can be further based on the second engine parameter data.

Responsive to the occurrence of the loss of power, the method can further include storing second engine parameter data associated with the engine. The second engine parameter data can includes an exhaust temperature of the engine. The evaluating whether the emergency power supply system would have passed the legislated test criterion can be further based on the exhaust temperature of the second engine parameter data. Responsive to the evaluating determining that the emergency power supply system would have failed the legislated test criterion, the method can further include communicating an alarm indicating that the emergency power supply system would have failed the legislated test criterion and at least one parameter associated with the legislated test criterion that caused the EPSS to fail the legislated test criterion associated with the test of the EPSS.

The electrical system can be a first electrical system of a first installation. Responsive to the alternate power source of the first installation supplying power to the first electrical system, the method can further include receiving, over a network, and storing real-time operational and parameter data associated with the EPS system of the first installation, the operational and parameter data including the electrical parameter data measured by the intelligent electronic device. The method can further include: receiving an external operating parameter that is independent from any real-time operational and parameter data associated with the EPS system of the first installation; and automatically generating a report based on at least the external operating parameter.

The external operating parameter can include operational and parameter data associated with a second EPS system of a second installation that is distinct from the first installation. The second installation can have a second alternate power source. The operational and parameter data associated with the second installation can include second electrical parameter data associated with the second alternate power source and measured by a second intelligent electronic device that measures a characteristic of power generated by the second alternate power source and that transforms the measured characteristic into the second electrical parameter data for communication over a network. The automatically generating the report can include benchmarking the operational and parameter data associated with the first installation against the operational and parameter data associated with the second installation. The method can further include displaying a comparison of the benchmarking.

The operational and parameter data associated with the first installation can further include (a) operational status information about a change of an operational status of the alternate power source of the first installation, and (b) status information indicating a status of an automatic transfer switch configured to switch power between the main utility power source and the alternate power source of the first installation. The operational and parameter data associated with the second installation can further include (a) operational status information about a change of an operational status of the alternate power source of the second installation, and (b) status information indicating a status of an automatic transfer switch configured to switch power between the main utility power source and the alternate power source of the second installation. The benchmarking can include comparing a transfer time calculated based on the operational status information and the status information associated with the first installation with a second transfer time calculated based on the operational status information and the status information associated with the second installation.

The external operating parameter can include at least two different report criteria associated with different users of the first installation. The automatically generating the report can include: automatically generating a first report based on the report criterion associated with a first of the users of the first installation; and automatically generating a second report based on the report criterion associated with a second of the users of the first installation. The first report and the second report can report different impacts on the first installation.

The first installation can be a hospital. The first user can include a medical care provider. The impact reported by the first report can include an impact on patient safety. The second user can include an administrator or manager of the hospital other than the medical care provider. The impact reported by the second report can include an impact on energy-consumption costs responsive to a passing of the EPS system. Responsive to the passing of the EPS system, the report can further include a recommendation to shed a load or loads in the first electrical system to generate savings in the energy-consumption costs of the hospital. The impact reported by the second report can include an impact on potential legal liability of the hospital responsive to a failure of the EPS system.

The external operating parameter can include a hypothetical set of operational and parameter data associated with a new alternate power source. The method can further include: evaluating the stored operational and parameter data to test a health of the alternate power source to produce a test result indicating the health of the alternate power source; determining whether the test result would change if the new alternate power source were installed by evaluating the hypothetical set of operational and parameter data to test the health of the new alternate power source; and including in the report an indication as to whether changing to the new alternate power source would change the test result. The hypothetical set of operational and parameter data can include a nameplate rating of the new alternate power source and recommended limits specified by a manufacturer of the new alternate power source.

According to an aspect of the present disclosure, a system is disclosed for automatically testing an emergency power supply system (EPSS) that supplies alternate power to an electrical system in the event of a disruption of power from a main utility power source that normally supplies power to the electrical system, the system comprising: an alternate power source configured to supply alternate power to the electrical system in the event of a disruption of power from the main utility power source that normally supplies power to the electrical system; a network; an intelligent electronic device that measures a characteristic of power generated by the alternate power source and that transforms the measured characteristic into corresponding electrical parameter data for communication over the network; a variable load bank coupled to the alternate power source that consumes energy produced by the alternate power source; an automatic transfer switch operable to switch power between the main utility power source and the alternate power source; and a computing device communicatively coupled to the network and configured to: each time the power supplied to the electrical system is switched by the automatic transfer switch from the main utility power source to the alternate power source, (a) receive a set of operational and parameter data associated with the EPSS, the set of operational and parameter data including operational status information about a change of an operational status of the alternate power source, electrical parameter data measured by the intelligent electronic device while the alternate power source supplies power to the electrical system, and status information indicating a status of the automatic transfer switch, and (b) cause the set of operational and parameter data to be stored; determine whether multiple sets of operational and parameter have been stored, and if so, evaluate the sets of operational and parameter data to identify at least one characteristic of the alternate power source that is deteriorating over an evaluation time period that includes the time period between a first of the times that the power supplied to the electrical system is switched from the main utility power source to the alternate power source and a most recent of the times that the power supplied to the electrical system is switched from the main utility power source to the alternate power source; assign a failure priority to the deteriorating characteristic; and generate a report that indicates the failure priority and the deteriorating characteristic.

The failure priority can include a non-critical priority and a critical priority. The characteristic can be a transfer time representing a time period that elapses between a start time when an instruction communicated to the automatic transfer switch and an end time when the automatic transfer switch switches power from the main utility power source to the alternate power source. The transfer time can deteriorating over time by trending upwards. The failure priority can be assigned to the non-critical priority.

A rate of change of the characteristic over the evaluation time period can exceed a predetermined value such that the deterioration of the characteristic appears to spike over the evaluation time period. The failure priority can be assigned to the critical priority.

According to a further aspect of the present disclosure, a computer program product is disclosed, which includes one or more non-transitory tangible media having a computer readable program logic embodied therein, the computer readable program logic configured to be executed to implement a method for automatically evaluating an emergency power supply (EPS) system that supplies alternate power to an electrical system in the event of a disruption of power from a main utility power source that normally supplies power to the electrical system. The method includes: responsive to each of multiple occurrences that the power supplied to the electrical system is switched by an automatic transfer switch from the main utility power source to the alternate power source, receiving, over a network, and storing a set of operational and parameter data associated with the EPS system of the electrical system during each of the occurrences to produce a plurality of sets of operational and parameter data, the operational and parameter data including (a) operational status information about a change of an operational status of the alternate power source, (b) electrical parameter data associated with the alternate power source and measured by an intelligent electronic device that measures a characteristic of power generated by the alternate power source and that transforms the measured characteristic into the electrical parameter data for communication over the network, and (c) status information indicating a status of an automatic transfer switch configured to switch power between the main utility power source and the alternate power source; evaluating the sets of operational and parameter data to identify at least one characteristic of the alternate power source that is deteriorating over an evaluation time period that includes the time period between the first of the occurrences and a most recent one of the occurrences; assigning a failure priority to the deteriorating characteristic; and automatically generating a report that indicates the failure priority and the deteriorating characteristic.

The present disclosure expressly contemplates combining any one or more of the disclosed systems, features, components, modules, blocks, or methods in any permutation.

The foregoing and additional aspects of the present disclosure will be apparent to those of ordinary skill in the art in view of the detailed description of various configurations and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 11B is an example display for configuring the transfer switches used in an EPSS test;

DETAILED DESCRIPTION

Figure 1:
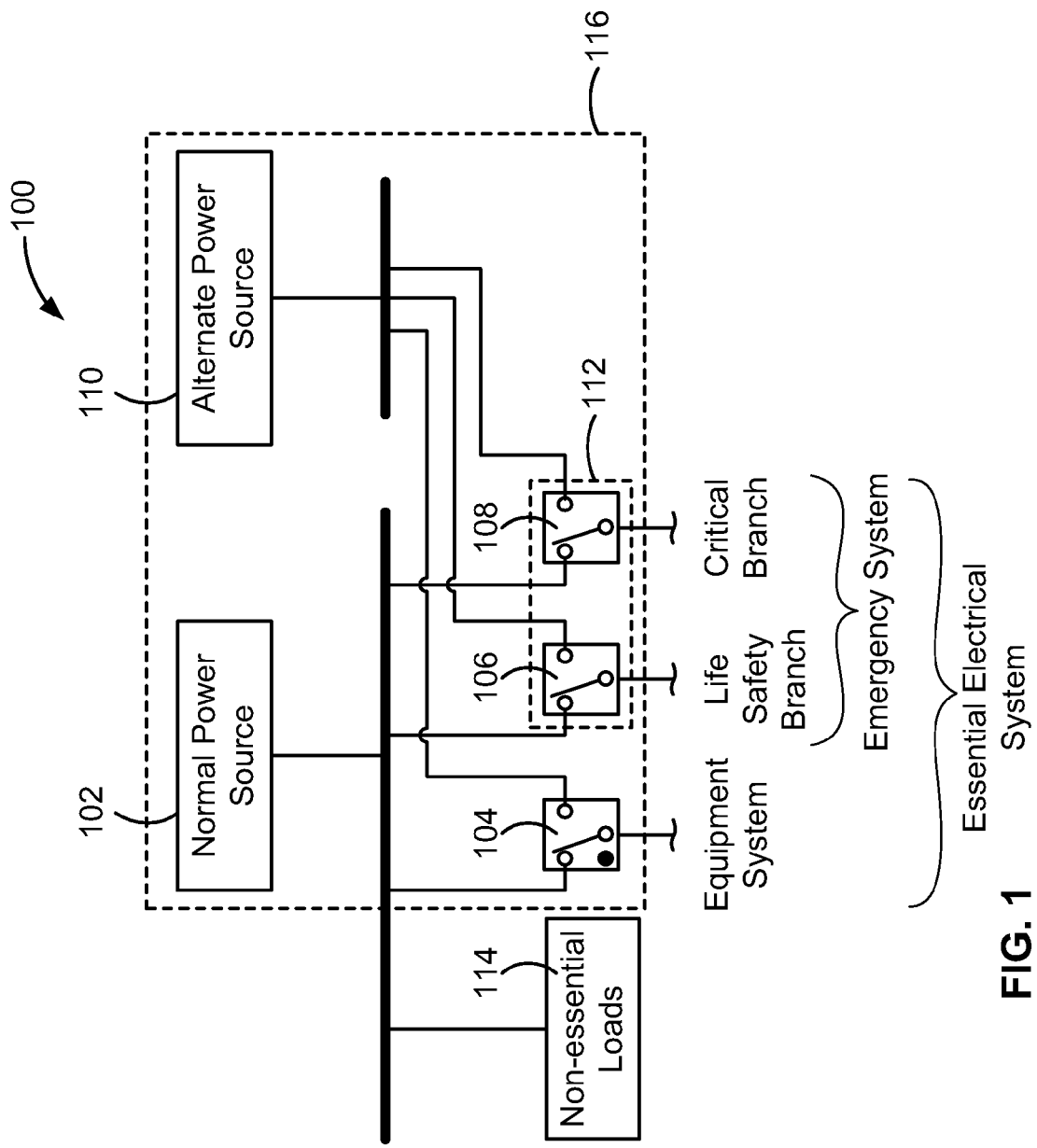
FIG. 1 is a functional block diagram of an exemplary electrical system that normally supplies electrical current to electrical loads from a normal power source and backup power from an alternate power source.

FIG. 1 is a functional block diagram of an example electrical system 100 that normally supplies electrical current to electrical loads within a facility or building, such as a hospital or healthcare facility, from a normal power source 102. When power supplied by the normal power source 102, such as a main utility power source, is interrupted, automatic switching equipment 104, 106, 108 automatically switches power supplied by the normal power source 102 to an alternate power source 110, such as a generator or genset, as that term is understood by those skilled in the art of power systems, or a direct current (DC) power source such as a battery. In the case of a hospital, the electrical system 100 can include an emergency system 112 that supplies power to essential loads within the hospital that are supplied by life safety or critical branch circuits. Non-essential loads 114 in the hospital remain unpowered during a power outage from the normal power source 102. Within the essential electrical subsystem 116, the automatic switching equipment can include a delayed automatic switching equipment 104 for delayed switching to loads that do not need to be immediately powered upon a loss of power from the normal power source 102.

Figure 2:
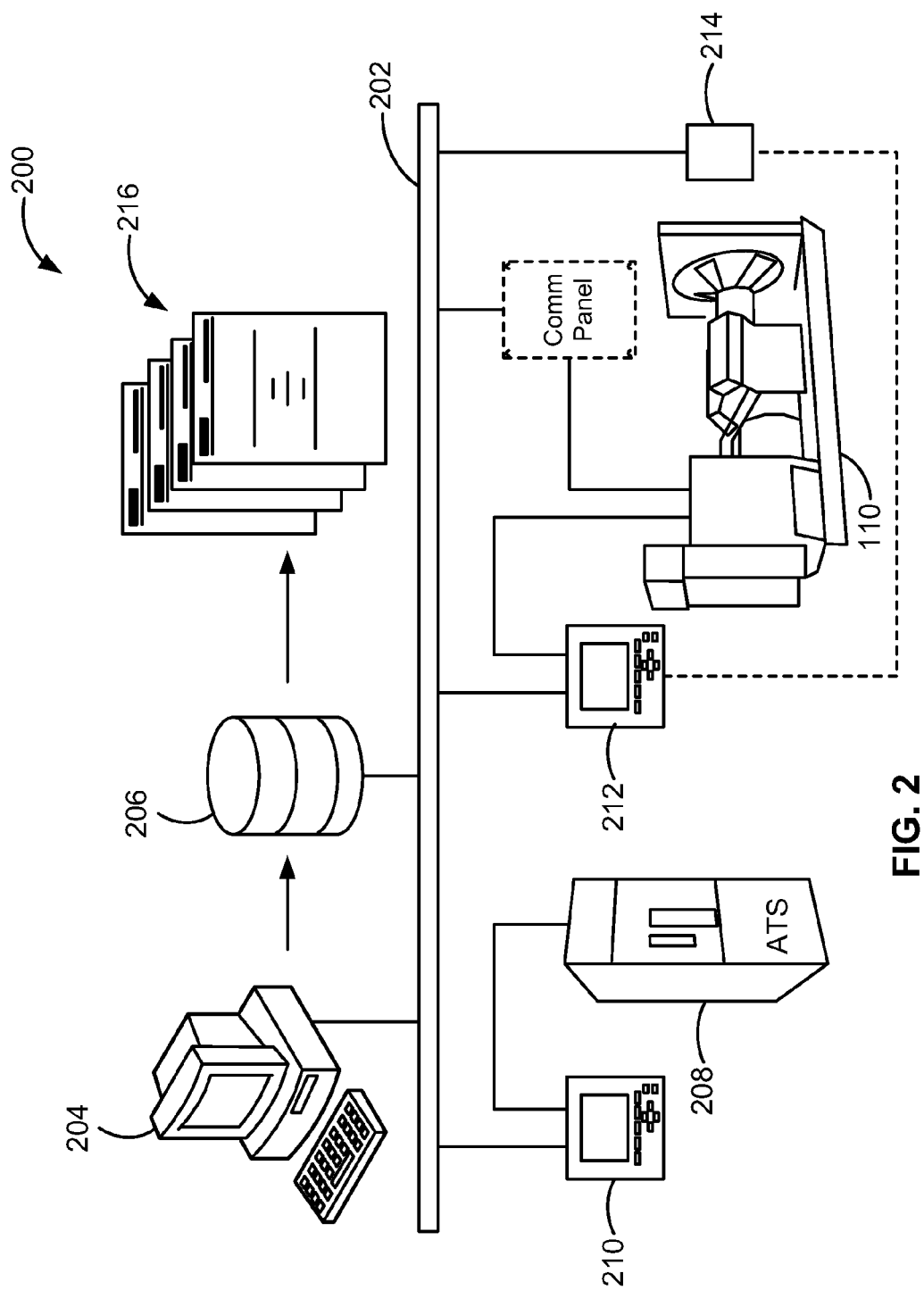
FIG. 2 is a functional block diagram showing an example configuration and components of a simplified automated emergency power supply system (EPSS) test configuration.

FIG. 2 is a functional block diagram showing an example configuration and components of a simplified automated emergency power supply system (EPSS) test configuration 200. The term "emergency" in EPSS refers to a condition in which power from the normal power source 102 is unavailable, rendering the electrical system 100 into an emergency condition as opposed to a normal or non-emergency condition when power is supplied from the normal power source 102. An emergency power supply system can also be referred to as a backup power (supply) system. In some buildings, such as hospitals or datacenters, it is important for some devices to continue to be powered during a loss of power from the normal power source 102. These devices can be termed "critical" or "non-critical," for example, but this terminology should not be confused with the term "emergency" in the context used herein. The EPS system can include an uninterruptible power supply (UPS), which supplies backup power to critical or important electrical loads within the electrical system 100 during a loss of power from the normal power source 102. The EPSS test configuration 200 includes a communications network 202, such as an Ethernet network, connected to a computing device 204, such as a computer, a server, a smart phone, or other network-enabled device that can display EPSS reports and/or evaluate EPS pass/fail criteria based on received parameter data, a database 206, and an automatic transfer switch (ATS) 208. A status (e.g., "Test," "Normal," and "Emergency") of the ATS 208 is monitored by a first monitoring device or programmable logic controller (PLC) 210, and a second monitoring device or intelligent electronic device ("IED") 212 measures a characteristic of power, such as current or voltage, generated by the generator 110 and transforms the measured current or voltage into corresponding electrical parameter data (e.g., power) for communication over the communications network 202. The second monitoring device 212 can conventionally monitor the current or voltage generated by the generator 110 by sensing the current or voltage via current or voltage transformers coupled to the corresponding conductors carrying the current or voltage generated by the generator 110. The monitoring device 212 can record current, voltage, or other electrical parameter data during startup of the generator or during a transfer of a load from the normal power source 102 to the alternate power source 110. The first and second monitoring devices 210, 212 can generally be any intelligent electronic device, such as a power meter, a relay, a PLC, or the like. When used to measure a characteristic of power, the first or second monitoring device 210, 212 has the capability to measure a characteristic of power (such as, for example, current and/or voltage or any advanced waveform information), transform the measured characteristic into corresponding electrical parameter data, store the electrical parameter data, and communicate the electrical parameter data to an external system over the communications network 202. Advanced waveform information can be derived from electrical data generated by the alternate power source 110. Engine failure in motor devices, such as generators, typically occur slowly over time. As such, there are characteristic warning signs or trends that can help with predicting the failure by analyzing the current or voltage waveforms generated by the engines. Certain signatures, patterns, or anomalies within these waveforms can provide a clue as to the health of the engine. In practice, the current or voltage generated by a healthy or normal engine operate within known waveforms and the current or voltage waveform produced by the engine of the alternate power source 110 can be analyzed against signatures of known failure modes (for example, bearing wear, unbalanced loads, vibration). The current or voltage waveform from the power generated by the alternate power source 110 can be analyzed across the harmonic spectrum for a particular signature, or the waveform can be analyzed to determine whether there are different current or voltage spikes that occur a regular intervals.

The status information of the ATS 208 can also include power source information indicating that normal power is available from the main utility power source 102 or that emergency or alternate power is available from the alternate power source 110. When this additional status information is reported to the first monitoring device 210, the EPS system can be used to log electrical and engine parameter data generated during actual power outages from the normal power source 102 in addition to electrical and engine parameter data generated during a test of the EPS system. An optional temperature sensor 214 measures the exhaust temperature of the engine of the generator 110 and communicates exhaust temperature data indicative of the exhaust temperature of the engine. The temperature sensor 214 can communicate the exhaust temperature data directly to the computing device 204 over the communications network 202 or indirectly via the second IED 212. Any combination of the electrical parameter data from the second IED 212, the exhaust temperature data from the second IED 212 or directly from the sensor 214, and the status information from the first monitoring device 210 can be stored in the database 206, which is accessed by the computing device 204 for evaluating a result of a test of the EPSS based on any combination of the exhaust temperature data, the electrical parameter data, and the status information.

The second IED 212 can be an ION7550 or ION7650 power monitor available from Schneider Electric. The second IED 212 monitors electrical parameters (e.g., current, voltage, frequency) of the generator 110 via analog inputs as well as three status contacts of the generator 110, which monitor the operational status of the generator 110 (e.g., "start," "running," and "stopped"), via digital inputs. A change in the operational status of any of the three contacts is stored in a memory of the second IED 212 along with a timestamp of the status change. The timestamp can include the time and date that the operational status of the generator 110 changed. In addition, one or more engine parameters of the generator 110, such as any combination of a battery voltage of a battery in the generator 110, the exhaust temperature of the engine of the generator 110, a coolant temperature or pressure of the engine of the generator 110, a differential fuel pressure across a fuel filter of the engine of the generator 110, or any waveform associated with an output of the engine of the generator 110, etc. can be received at the analog inputs of the second IED 212 and stored in a memory of the second IED 212. Or, in examples in which the controller of the engine in the generator 110 communicates via the MODBUS® messaging protocol, the power monitor 212 can retrieve these engine parameters directly from the engine controller.

The computing device 204 evaluates the test result based on any combination of the engine parameter data and the electrical parameter data and generates one or more reports 216, which can be displayed on a video display or printed on a printer. The first monitoring device 210 captures the "Test," "Normal" and "Emergency" status information transmitted by that ATS 208. All three status contacts are tied to the digital inputs of the first monitoring device 210, which again can be a PLC. As described above, the status information from the ATS 208 can further include contacts that indicate "utility power available" or "emergency power available." These additional contacts allow the user of the computing device 204 to generate EPSS reports 216 responsive to an actual utility outage in addition to responsive to an EPSS test.

The status information, engine parameter data, and the electrical parameter data are automatically uploaded by the monitoring devices in the electrical system 100 via the communications network 202 to the database 206, which can be an SQL server database, such as an ION Enterprise SQL Server database available from Schneider Electric. A reporting module of the EPSS 200 retrieves the data from the database 206 to produce EPSS test reports 216. The reporting module is an machine-executable component that runs on the computing device 204.

Figure 3A:
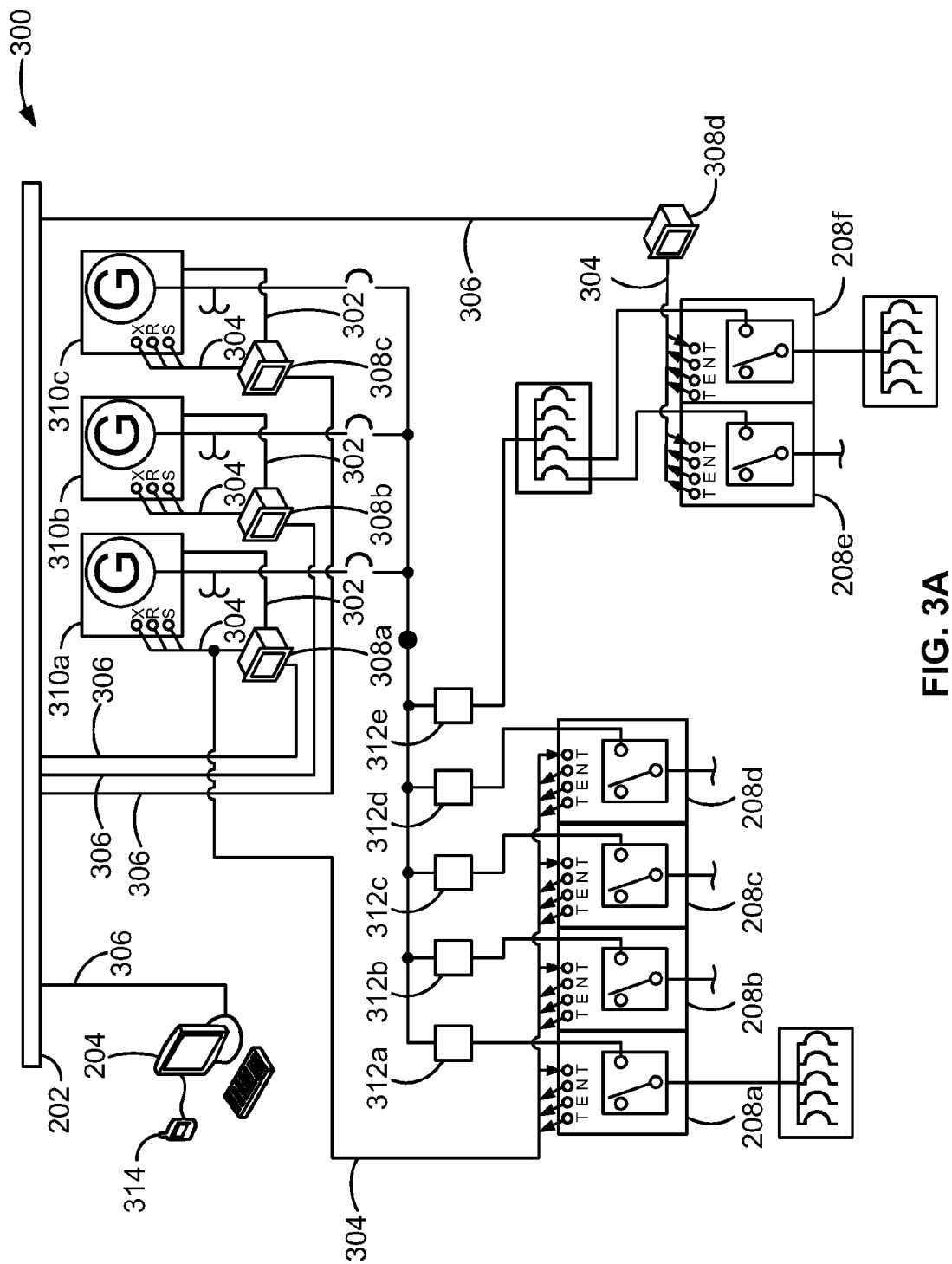
FIGS. 3A-3C are functional block diagrams of an essential, enhanced, and comprehensive EPSS configuration, respectively.
Figure 3B:
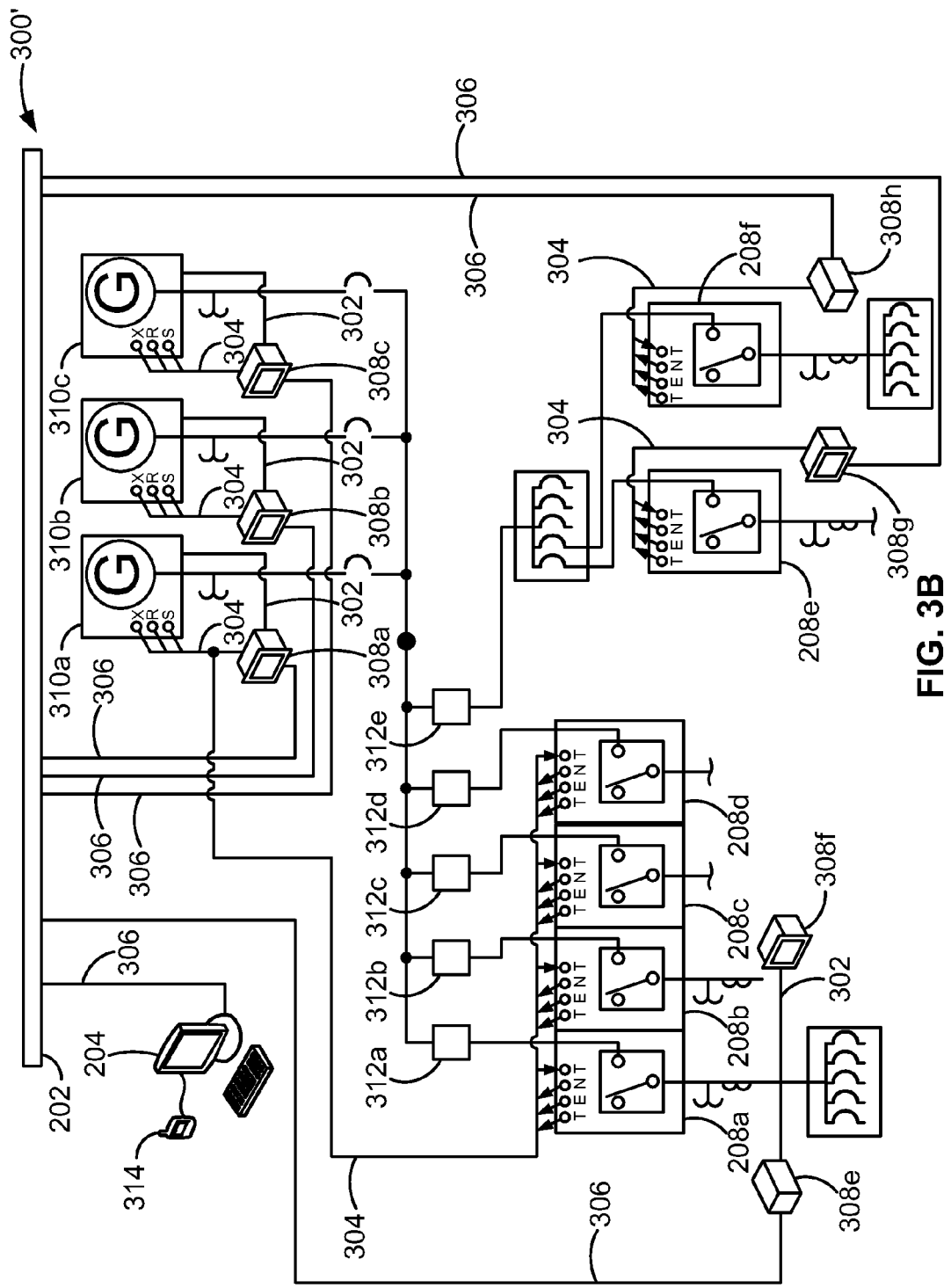
Figure 3C:
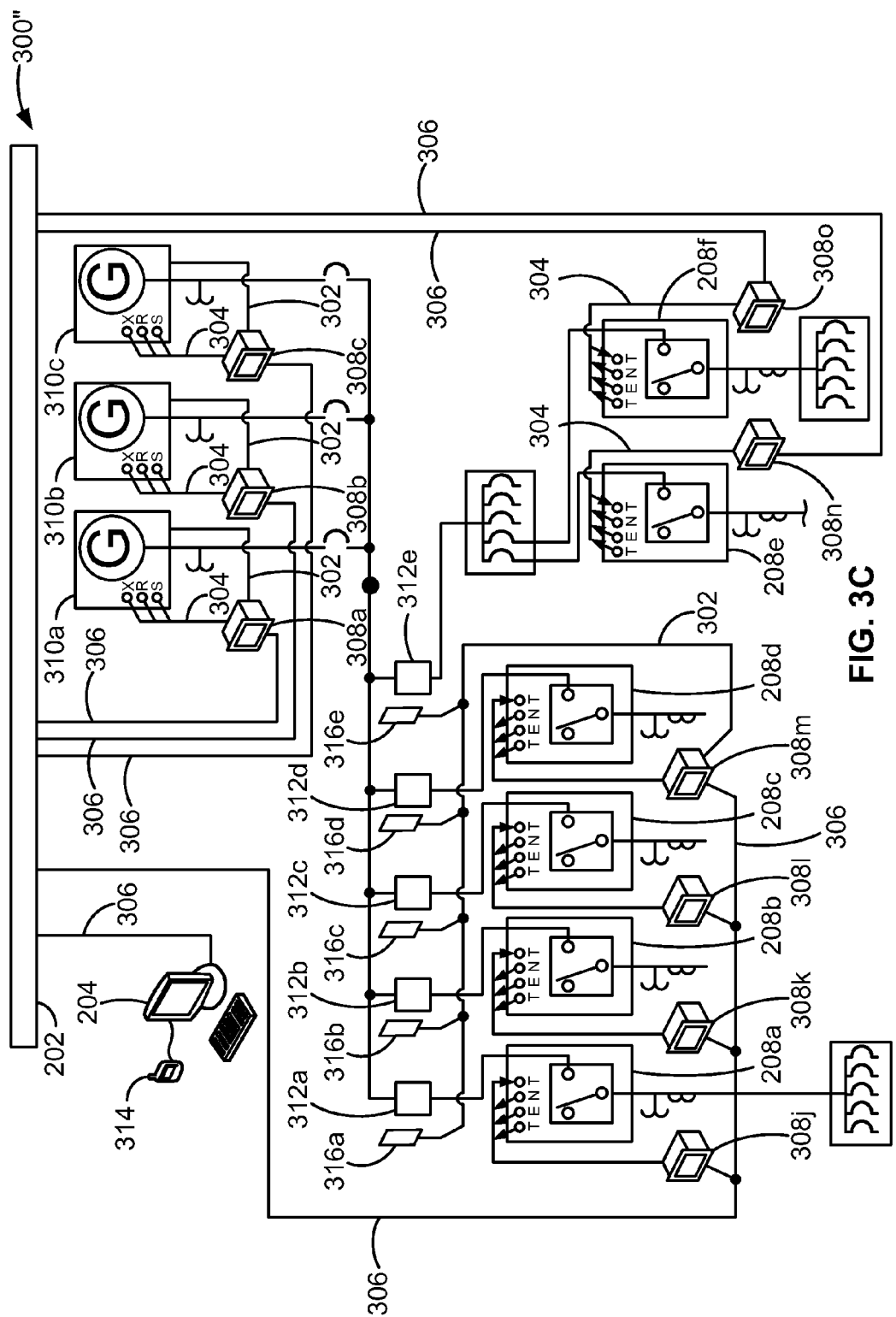

The functional block diagram shown in FIG. 2 illustrates the basic components involved in the EPSS 200, and of course there are numerous ways an EPS system can be configured for conducting automated tests as disclosed herein. FIGS. 3A-3C illustrate three different exemplary EPSS configurations called essential or basic (FIG. 3A), enhanced (FIG. 3B), and comprehensive (FIG. 3C). Each of these configurations will be discussed in turn.

In FIG. 3A, an essential or basic EPSS configuration 300 is shown, which is based on the EPSS 200 shown in FIG. 2. The lines numbered 302 communicate over a MODBUS® serial communications protocol, the lines numbered 304 correspond to digital I/O lines, and the lines numbered 306 communicate using the Ethernet communications protocol. The essential EPSS configuration 300 includes the communications network 202 and the computing device 204 shown in FIG. 2. In this example, the communications network 202 is an Ethernet network that is coupled to the computing device 204 and to first, second, third, and fourth monitoring devices or programmable logic control devices 308a,b,c,d. Any of the monitoring devices 308 disclosed herein can also correspond to the monitoring devices 210, 212 shown in FIG. 2, and vice versa. The first, second, and third monitoring devices communicate engine parameter data associated with first, second, and third alternate power sources 310a-c by a serial communications protocol, such as MODBUS®, to the respective alternate power sources 310a,b,c such as diesel- or gas-powered generators. Each generator 310a,b,c includes at least three digital outputs (labeled X indicating an engine starting status, R indicating an engine running status, and S indicating an engine stopped status) that supply the respective operational status of the engine to the corresponding monitoring device 310a,b,c. The fourth monitoring device 308d monitors the status of one or more ATS switches 208e,f, each having three digital outputs indicating the status of the ATS switch as test (labeled "T"), emergency (labeled "E"), or normal (labeled "N"). Four local ATS switches 208a-d are connected to respective overcurrent devices (OCD) with a switching mechanism such as a MASTERPACT® power circuit breaker available from Schneider Electric. The digital outputs of the ATS switches 208a-d indicating status information of each of the ATS switches are received at corresponding digital inputs of the first monitoring or PLC device 308a. Each of the ATS switches 208a-f includes a control digital input, and each of the monitoring devices 308a, 308d includes a corresponding control digital output (labeled "T" in FIG. 3A), for instructing by the monitoring device 308a,d each of the corresponding ATS switches 208a,b,c,d,e,f to change its status to a test status for conducting a test of the EPS system 200.

For example, the monitoring devices 308a-c can be ION7550 power monitors available from Schneider Electric, which record and store electrical parameter data, including power quality data, voltage sag/swell data, transient data, from each of the corresponding generators 310a-c, status information regarding each of the ATS switches 208a-d, and can be powered by batteries or a uninterruptible power supply (UPS) during an outage of power from the main utility power source 102. The monitoring device 308d can also be an ION7550 power monitor available from Schneider Electric, and monitors ATS switches 208e,f that are remote from the ATS switches 208a-d. The computing device 204 can be communicatively coupled to a paging device 314 for communicating event-based alarms or other defined event information during testing of the EPSS 200.

The automated EPSS configuration 300 shown in FIG. 3A has basic functionality in which power monitoring is implemented only at the generators 310a,b,c. All ATS switches 208a-f have status information only (test, emergency, normal) monitoring. This basic configuration can be suitable for cost-sensitive projects.

For configurations in which power metering is required at the ATS level as well as at the generator level, the exemplary enhanced configuration 300' configuration shown in FIG. 3B can be used. In this example configuration 300', ATS status information can also be tied into the respective ATS metering, or any nearby monitoring device with digital inputs Like components are shown with like reference numbers. In FIG. 3B, additional monitoring devices 308e,f,g,h are installed to provide electrical parameter data from the ATS switches 208a-f. The monitoring devices 308e-h can capture and store peak demand values and other information as specified in Section 220.87 of the National Electrical Code (NEC). In this enhanced EPSS configuration 300', the monitoring devices 308f, 308g can be PM8-based power monitors available from Schneider Electric. The monitoring devices 308e-h can optionally record electrical parameter data, such as voltage, during a transfer or switching of a load by the corresponding ATS 208 from the normal power source 102 to the alternate power source 110, for example, to verify that the transfer switching is not causing unusual voltage disturbances. The computing device 204 can initiate a test of the EPSS system 200 (e.g., by instructing an ATS 208 to switch to a test status, initiating a transfer of power from the normal power source 102 to the alternate power source 110) and can also provide status information associated with the overcurrent devices 312a-e.

An EPSS test is run for a legislated period of time, typically starting when the alternate power source (e.g., genset) 110 has reached its required operating conditions, which can be, for example, a load percentage based on the nameplate rating of the engine, exhaust gas temperature, or a combination of both. The user of the computing device 204 can specify test parameters while an EPSS test is running, such as the test duration (e.g., 30 minutes), time remaining, minimum load (e.g., 30% of nameplate rating), minimum exhaust temperature (e.g., 800° F.), and the like. During an EPSS test, the user can view in real-time the operating parameters of the generator 110 in any detail, such as the engine operating temperature, the engine voltage, the engine speed, power factor, phase current, phase voltage, frequency, engine oil temperature, engine oil pressure, engine fuel pressure, fuel consumption rate, engine fuel level, manifold air temperature, battery voltage, engine coolant temperature, nameplate rating of the engine, loading of the engine in Kw, kVA, or kVAR, and the like. Similar readings can be viewed in real-time for each ATS 208 in the EPS system 200, such as voltage, apparent power, current, frequency, power factor, reactive power, real power, and the like. All recorded test data can be stored in the database 206.

Finally, for EPSS configurations in which power quality is important for critical machinery or equipment such as MRI machines in hospitals or servers in datacenters, it is desirable to equip selective ATS switches with enhanced power quality metering. FIG. 3C illustrates an example comprehensive EPSS configuration 300" in which the generators 310a-c are equipped with power quality metering. The configuration 300" is similar to the configuration 300' except that the over-current devices (OCD) 312a-e include a communications interface 316a-e, and each ATS 208a-f is monitored by a corresponding monitoring device 308j-o. The communications interface 316a-e communicates electrical parameter data (such as power quality data, peak demand data, and other maximum demand data) and ATS status information (such as test, emergency, and normal) via a serial communications protocol 302 to the computing device 204 via the monitoring device 308m over Ethernet 306. Each monitoring device 308j-o can optionally include an additional input from each of the ATS switches 208a-f indicating a status of normal power available contacts and emergency power available contacts, which indicate the source of power (e.g., normal 102 or alternate 110) delivered through the ATS switch 208. As indicated above, each of the monitoring devices 308a-c that monitor the respective generators 310a-c monitors whether the generators 310a-c can support a minimum required load level (e.g., 30% in the United States) for a minimum period of time (e.g., 30 minutes). The monitoring devices 308a-c begin recording when the exhaust temperature being monitored by the monitoring devices 308a-c reaches the stack temperature.

The basic, enhanced, and comprehensive configuration examples shown in FIGS. 3A-3C can be used in conjunction with any EPSS testing solution disclosed herein. Of course, these configurations can be scaled to any size to suit a particular application, and fewer or more devices can be used than those shown. The EPSS 200 shown in FIG. 2 is a basic EPSS, which can be expanded to any configuration, such as the configurations 300, 300', and 300" shown in FIGS. 3A-3C. As used herein, the configurations 300, 300', 300" may also be variously referred to as an EPSS.

The EPSS testing solutions described herein advantageously provide automatic exhaust gas temperature support. A legislated pass/fail criteria for an EPS system is typically based on a percentage of load seen by the generator. The EPSS testing solutions provided herein include an evaluation of the generator's exhaust gas temperature against legislated criteria, such as those found in NFPA 99 or 110, the Joint Commission, formerly known as the Joint Commission on Accreditation of Healthcare Organizations (JCAHO), the Centers for Medicare and Medicaid Services (CMS), or Det Norske Veritas (DNV). Examples of a legislated test criterion include a criterion or criteria determined by any requirement set forth in a code or a standard of the National Fire Protection Association (NFPA), the Joint Commission, CMS, DNV, the Health Technical Memorandum (HTM), the Canadian Standards Association (CSA), the Australian/New Zealand Standard (AS/NZS), the International Electrotechnical Commission (IEC), or any other applicable code or standard of a jurisdiction or governmental entity. Examples of legislated test criteria, which are also provided further below, include a transfer time, such as 10 seconds, a load percentage expressed as a percentage of a nameplate rating specified by the manufacturer of the engine 110, such as 30%, a test period, such as 30 minutes, a minimum exhaust temperature, such as 800° F. The term "transfer time," "load percentage," and "nameplate rating" are used as they would be understood by those skilled in art of power systems and backup or emergency power systems.

The EPSS testing solutions disclosed herein can advantageously combine load test and exhaust gas temperature evaluations using a logical AND and a logical OR. In other words, the user of the computing device 204 can select whether to evaluate an EPS system using load percentage only (logical OR), exhaust gas temperature only (logical OR), or both load percentage and exhaust gas temperature (logical AND). The load percentage is a percentage of a nameplate rating (usually expressed in kW or kVA) specified by the manufacturer of the engine of a genset 110. For example, a 30% load percentage of a 1000 kW genset 110 means that a 300 kW load is consuming energy produced by the genset 110.

The EPSS testing solutions disclosed herein can advantageously vary the transfer time requirements according to different priority levels, such as priority levels defined for non-critical equipment, life safety equipment, or critical equipment, for example.

The EPSS testing solutions disclosed herein can advantageously utilize variable load banks to test an EPS system that cannot be tested using the actual loads of the facility in which the EPS system is installed. While it is known to use load banks for such testing, the EPSS testing solutions disclosed herein can automatically vary the load banks to suit a particular legislated criteria, such as defined by an applicable regulation such as NFPA 99 or 110. Using variable loads can avoid or reduce wet-stacking of the engine, for example, by allowing the load to be sized in accordance with the engine's nameplate rating.

The EPSS testing solutions disclosed herein can advantageously record, during a real loss of main utility power 102, the same data that would be recorded during an EPSS test to evaluate the data as if undergoing a test of the EPSS.

The EPS systems disclosed herein include a reporting module, which conventionally formats data into a report that can be displayed or printed by the user of the computing device 204. The reporting module can import information on similar EPSS installations elsewhere, either in the facility or outside the facility. The EPSS reporting module can compare manufacturer's recommended data against operating parameters to benchmark other installations and provide other details to the user, however it can also retrieve data from other EPSS installations, either in the facility or outside the facility as well. For example, the user of the computing device 204 may want an EPSS report to benchmark against similar installations (e.g., similar in size, equipment, loading, etc.) or against installations in the same business/facility entity (e.g., Campus #1 and Campus #2 which have their own separate EPSS systems).

The failure (or passing) of the EPS system can generate specific alarms and reports based on the needs of different users of the facility or building in which the EPS system is installed. For example, in a hospital building, if a switch to backup-power fails the EPSS test and takes longer than required, an automated alarm and report to the Nurses' stations would alert the nurses that the risk to patients connected to critical machines may be high. Also, CEOs and Hospital Administrators may wish a specific report to highlight that their safety and liability may have been impacted by an EPSS test failure and needs immediate attention, or vice-versa that the multiple instances of an EPSS test passing legislated criteria are consistent enough to warrant load-shedding to generate cost savings. Other stakeholders who may be interested in different levels of criticality are facility managers, doctors or surgeons, or executive managers, for example. CEOs, hospital administrators, and executive management may be concerned about three main problems in their electrical distribution systems and electrical equipment: reliability, traceability, and liability. These stakeholders want to ensure that the hospital systems are reliable to reduce any failures in the EPS system. They want to record the events that lead up to any failure in case of a lawsuit and to protect the hospital from liability. These stakeholders rely on the facility manager of the hospital to ensure that the EPS system is reliable and that appropriate EPSS testing reports are being created. Facility managers are concerned about meeting regulatory and reporting requirements around the hospital schedule with minimal disruption. Doctors and surgeons must have a reliable and stable supply of power in the operating room for life-sustaining equipment such as ventilators.

Based on the type of failure of the EPSS, the reporting module can also provide a level of criticality of the failure by highlighting whether the failure needs immediate action or can be monitored until fixed during the next schedule maintenance period. For example, consider the following two cases: Consider in one example that the EPSS failure is due to one characteristic of the generator failing, such as EPSS transfer time, which over a specified time period (e.g., one year) the EPSS test notes has been trending slowly upwards and has finally reached a failure mode in its ability to meet the legislated transfer time criteria. In this example, the failure may be tagged by the EPSS as "non-critical" and routine maintenance may solve the problem. In a second example, suppose the EPSS failure is based on a characteristic of the generator failing, which over time is seen as a sudden spike in the failed value. This type of generator failure over time can be tagged by the EPSS as "critical" for immediate investigation into the failure. The user can apply logic analysis to adjust the strict pass/fail report to give an assessment on the criticality of the actual pass/failure. In other words, the EPSS can automatically assign different priorities to different types of failures and report accordingly.

While testing the EPSS, the reporting module can also be used to conduct "what-if" analyses to compare test results against alternate proper operating parameters of an EPS system that would pass one or more legislated test criteria. Because the EPSS can receive device-specific information such as nameplate ratings and manufacturer's recommended limits, the reporting module can run a virtual EPSS report using new device-specific information. This "what-if" analysis can be used where an EPSS test has been evaluated and reports a failure. By engaging in the what-if analysis, the user of the computing device 204 can determine whether the EPSS test would pass the legislated test criterion if new capital equipment were installed, or a component of the EPSS were upgraded. This ability to run virtual EPSS tests using different device-specific information provides the user the ability to easily and quickly create a business case for a capital-cost project, based on the failed EPSS testing.

Figure 4:
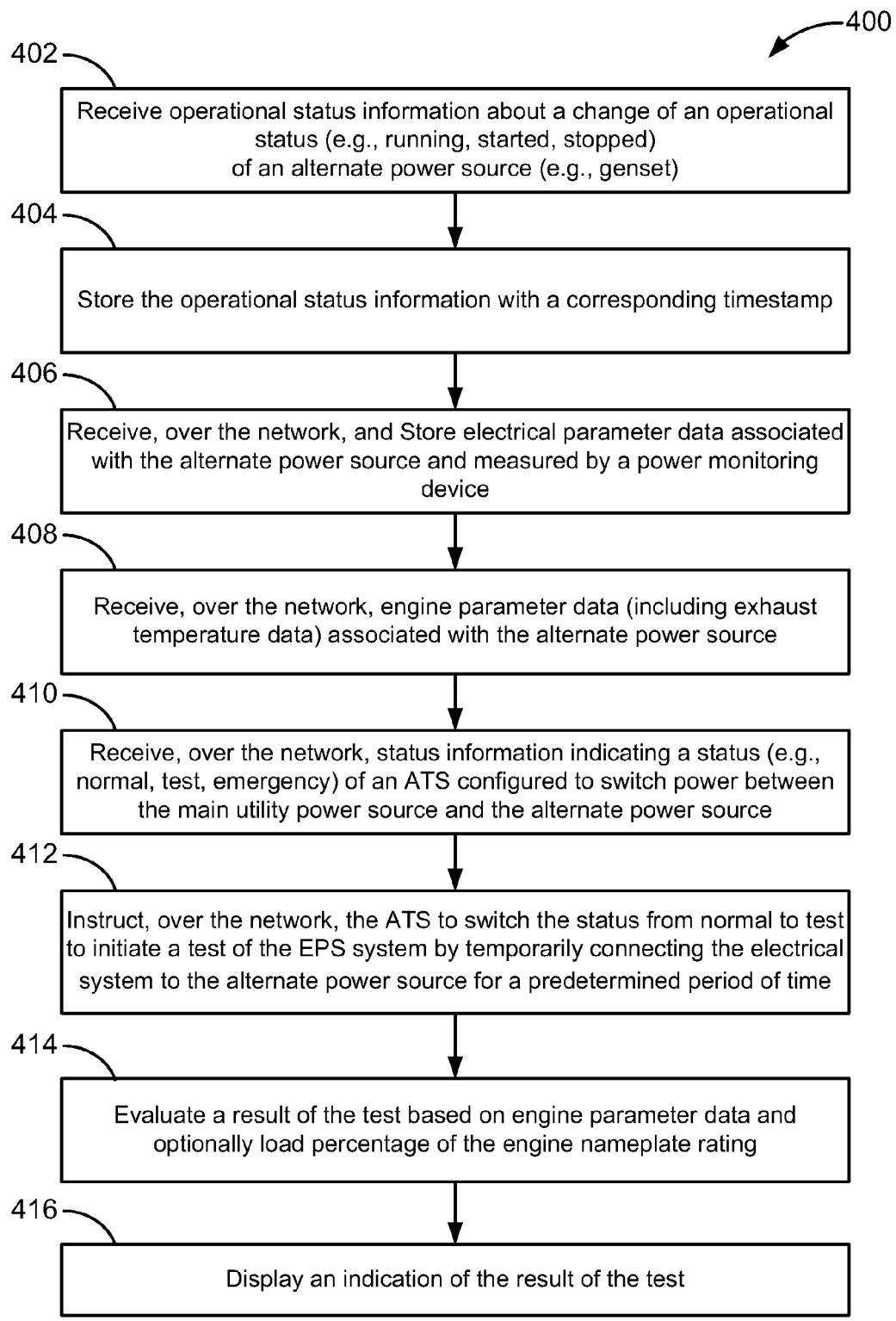
FIG. 4 is a flowchart diagram of an EPSS testing algorithm that uses engine parameter data to evaluate a result of an EPSS test.

The EPSS testing solutions disclosed herein can be carried out by one or more algorithms executed by the computing device 204, for example. Any of the algorithms or methods disclosed herein can be implemented by the simplified automated EPSS test configuration 200 shown in FIG. 2, or by any of the example configurations 300, 300', 300" shown in FIGS. 3A-3C. A first EPSS testing algorithm 400 is shown in FIG. 4. The EPSS may be the EPSS 200 shown in FIG. 2, and supplies alternate power to an electrical system, such as the electrical system 100, in the event of a disruption of power from a main utility power source, such as the normal power source 102, which normally supplies power to the electrical system 100. The algorithm 400 receives, over a communications network, such as the communications network 202, operational status information (e.g., the engine is running, the engine has started, or the engine has stopped) about a change of an operational status of an alternate power source 110 (402). The alternate power source 110 can be an engine-generator (also called a genset) having an engine. The engine conventionally has a nameplate rating specified by the manufacturer of the engine. The algorithm 400 stores the operational status information with a corresponding timestamp indicating when the change of the operational status occurred (404). As used herein, it should be understood that the computing device 204 or the database 206 or both can receive data that is said to be received by any algorithm disclosed herein. Those skilled in the art will appreciate that the phrase "the algorithm receives" or "the algorithm stores" refers to a receiving or storing function, but that the data being received or stored can be physically received or stored on the computing device 204 and/or the database 206 and/or an external server. Likewise, it is understood that the phrase "the algorithm instructs" can be carried out by a controller executing the algorithm or controlled by or under the control of the algorithm, which controller in turn communicates the specified instruction.

The algorithm 400 receives, over the network 202, and stores electrical parameter data associated with the alternate power source 110 and measured by an intelligent electronic device, such as the monitoring device 212 or any of the monitoring devices 308, which measures a characteristic of power (e.g., current and/or voltage) generated by the alternate power source 110. The monitoring device 212, 308 that monitors the alternate power source transforms the measured characteristic into the electrical parameter data (e.g., power data) for communication over the network 202 (406). The algorithm 400 receives, over the network 202, engine parameter data associated with the alternate power source 110 (408). The engine parameter data can include exhaust temperature data indicative of an exhaust temperature of the engine of the genset 110 as measured by the temperature sensor 214. The algorithm 400 receives, over the network 202, status information indicating a status (e.g., test, emergency, or normal) of an automatic transfer switch 208 configured to switch power between the main utility power source 102 and the alternate power source 110 (410).

The algorithm 400 instructs, over the network 202, the ATS 208 to switch the status from a normal status to a test status to initiate a test of the EPSS 200, 300, 300', 300" by temporarily connecting the electrical system 100 to the alternate power source 110 for a predetermined period of time (412), such as determined by a legislated test criterion, for example, for 30 minutes. The algorithm 400 evaluates a result of the test based on at least the engine parameter data (414) and optionally the load percentage of the engine nameplate rating.

An evaluation, in some aspects disclosed herein, entails a comparison of data measured or produced during the test against a criterion, such as a legislated test criterion as disclosed herein. The test produces results, which generally refers to parameter data captured, measured, or produced during the test. The evaluation uses the results to determine an outcome of the test, and the outcome can be a pass or a fail, for example. The data that comprises the test result depend on what parameters were used by the test. For example, in the case of exhaust gas temperature, the test result includes exhaust temperature values measured by the temperature sensor 214. In the case of electrical parameter data, the test result includes load percentage values calculated from the current or voltage measured by the monitoring device during the test period. In the case of measuring a transfer time, the test result includes a time value, such as 10 seconds, corresponding to the amount of time that elapsed between instructing the ATS to switch to a test status to receiving a confirmation that the engine has started running.

Returning to FIG. 4, the evaluation includes determining whether the engine parameter data, such as the engine exhaust temperature, satisfies a legislated test criterion specified for the engine exhaust temperature. The algorithm 400 displays an indication of an outcome (e.g., pass or fail) the result of the test (416). For example, if the engine exhaust temperature does not satisfy the legislated test criterion specified for that parameter, the algorithm 400 reports that the test failed. On the other hand, if the engine exhaust temperature satisfies the applicable legislated test criterion, the algorithm 400 reports that the test passed. Of course, if other criteria are taken into account in evaluating the result of the test, such as load percentage data associated with the electrical parameter data, the algorithm 400 determines whether these additional parameters satisfy the applicable legislated test criteria. When the load percentage of the nameplate rating of the engine of the genset 110 is also included in the test evaluation, the algorithm 400 calculates the load percentage from the electrical parameter data (e.g., power) during the test.

For example, a legislated test criteria may specify that an EPSS test must support a minimum load percentage of 30% of the engine's nameplate rating for thirty minutes, and maintain a minimum exhaust temperature of 800° F. The operational status information is used to verify that the engine was running during the legislated test period (in this example, thirty minutes, which is also referred to as "engine runtime"). The status information is used to verify that the engine is carrying the loads during the test. The operational status information together with the status information is used to calculate the transfer time between the time the ATS is instructed to switch to the test status to the time that the engine reports its status as running.

Figure 5A:
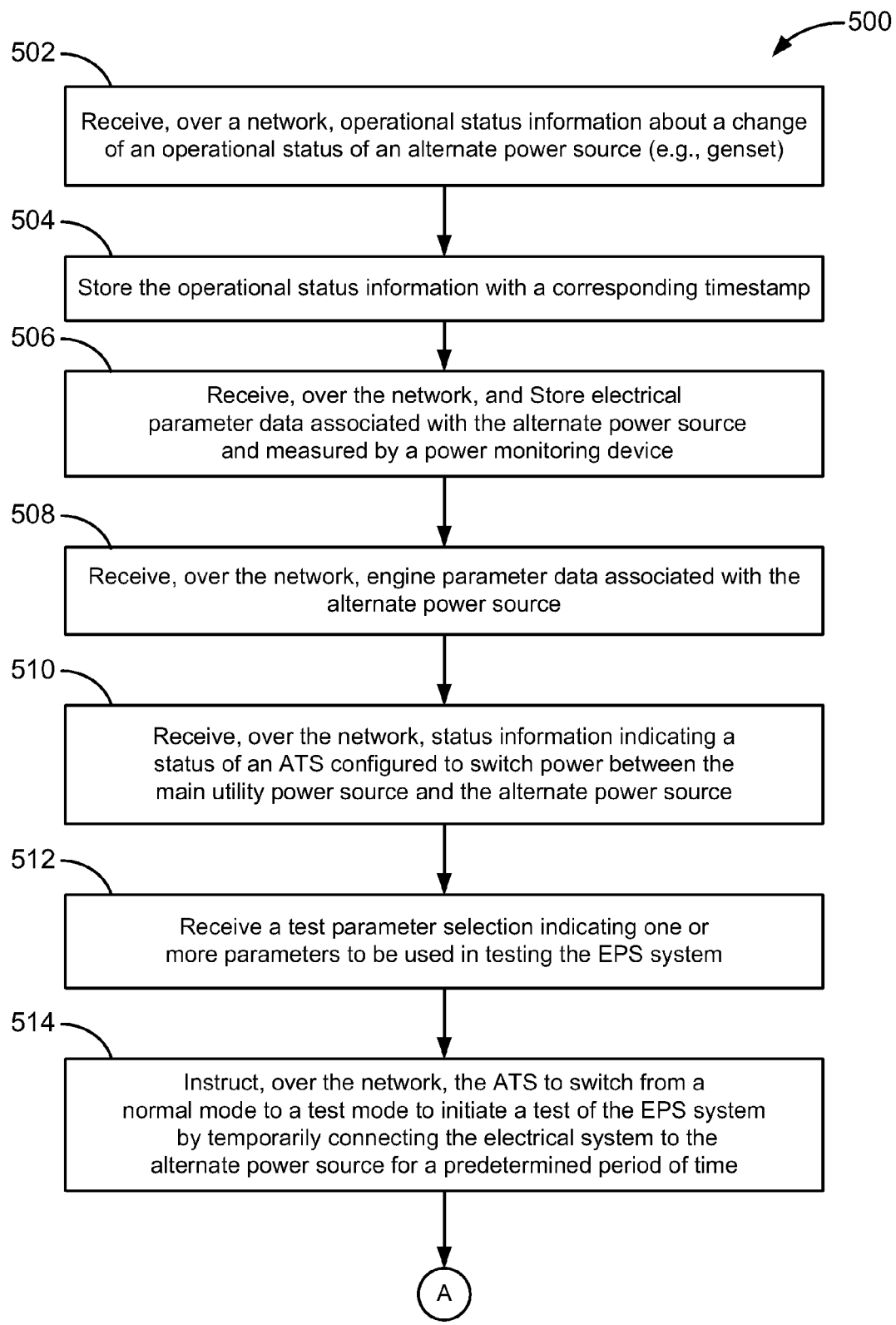
FIGS. 5A-5B are a flowchart diagram of an EPSS testing algorithm that allows the user to select which parameter data to be used to evaluate a result of an EPSS test.
Figure 5B:
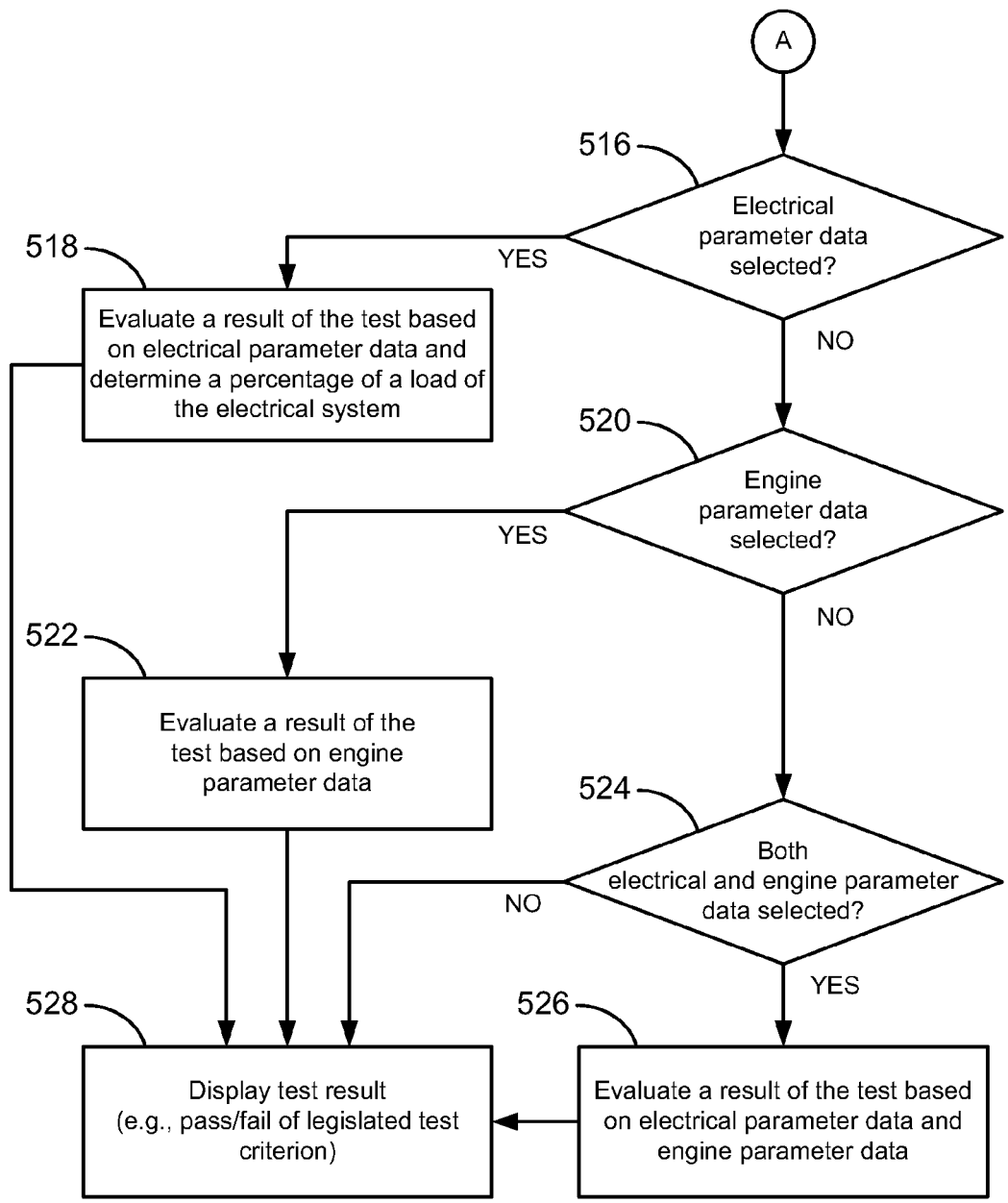

FIG. 5 illustrates an algorithm 500 that allows the user to test an EPSS using either load percentage or exhaust temperature or both. The algorithm 500 automatically tests the EPSS 200, 300, 300', 300" by receiving, over a network 202, operational status information about a change of an operational status of an alternate power source 110 (e.g., an engine-generator or genset) having an engine with a nameplate rating (502). The algorithm 500 stores the operational status information with a corresponding timestamp indicating when the change of the operational status occurred (504). The algorithm 500 receives, over the network 202, and stores electrical parameter data associated with the alternate power source 110 and measured by an intelligent electronic device 212, 308 that measures a characteristic of power generated by the alternate power source 110 and that transforms the measured characteristic into the electrical parameter data for communication over the network 202 (506). The algorithm 500 receives, over the network 202, engine parameter data associated with the alternate power source 110 (508). The algorithm 500 receives, over the network 202, status information indicating a status of an automatic transfer switch 208 (FIG. 2, 3A, 3B, or 3C) configured to switch power between the main utility power source 102 and the alternate power source 110 (510). The algorithm 500 receives a test parameter selection indicating one or more parameters to be used in testing the EPSS (512). The algorithm 500 instructs, over the network 202, the automatic transfer switch 208 to switch from a normal mode to a test mode to initiate a test of the EPSS 200 by temporarily connecting the electrical system 100 to the alternate power source 110 for a predetermined period of time (514).

The algorithm 500 determines whether the test parameter selection indicates that the electrical parameter data is to be used in testing the EPSS (516). If so, the algorithm 500 evaluates a result of the test based on at least the electrical parameter data (518) and determines a percentage of a load of the electrical system 100 relative to the nameplate rating of the engine of the genset 110. The algorithm 500 determines whether the test parameter selection indicates that the engine parameter data is to be used in testing the EPSS (520). If so, the algorithm 500 evaluates a result of the test based on at least the engine parameter data (522). The algorithm 500 determines whether the test parameter selection indicates that both the electrical parameter data and the engine parameter data are to be used in testing the EPSS 200 (524). If so, the algorithm 500 evaluates a result of the test based on at least the electrical parameter data and the engine parameter data (526). Once the algorithm 500 has completed evaluating the test result, an indication of an outcome the test result is displayed (528). Note that decision blocks 516, 520, 524 can be performed in any order or simultaneously. The outcome of the test result can include a pass indicating that a legislated test criterion is satisfied and a fail indicating that the legislated test criterion is not satisfied. As mentioned above, the legislated test criterion can be determined by a requirement set forth in a code or a standard of the National Fire Protection Association (NFPA), the Health Technical Memorandum (HTM), the Canadian Standards Association (CSA), the Australian/New Zealand Standard (AS/NZS), the International Electrotechnical Commission (IEC), or any other jurisdictional or governmental entity that promulgates codes or standards applicable to power systems.

Figure 6A:
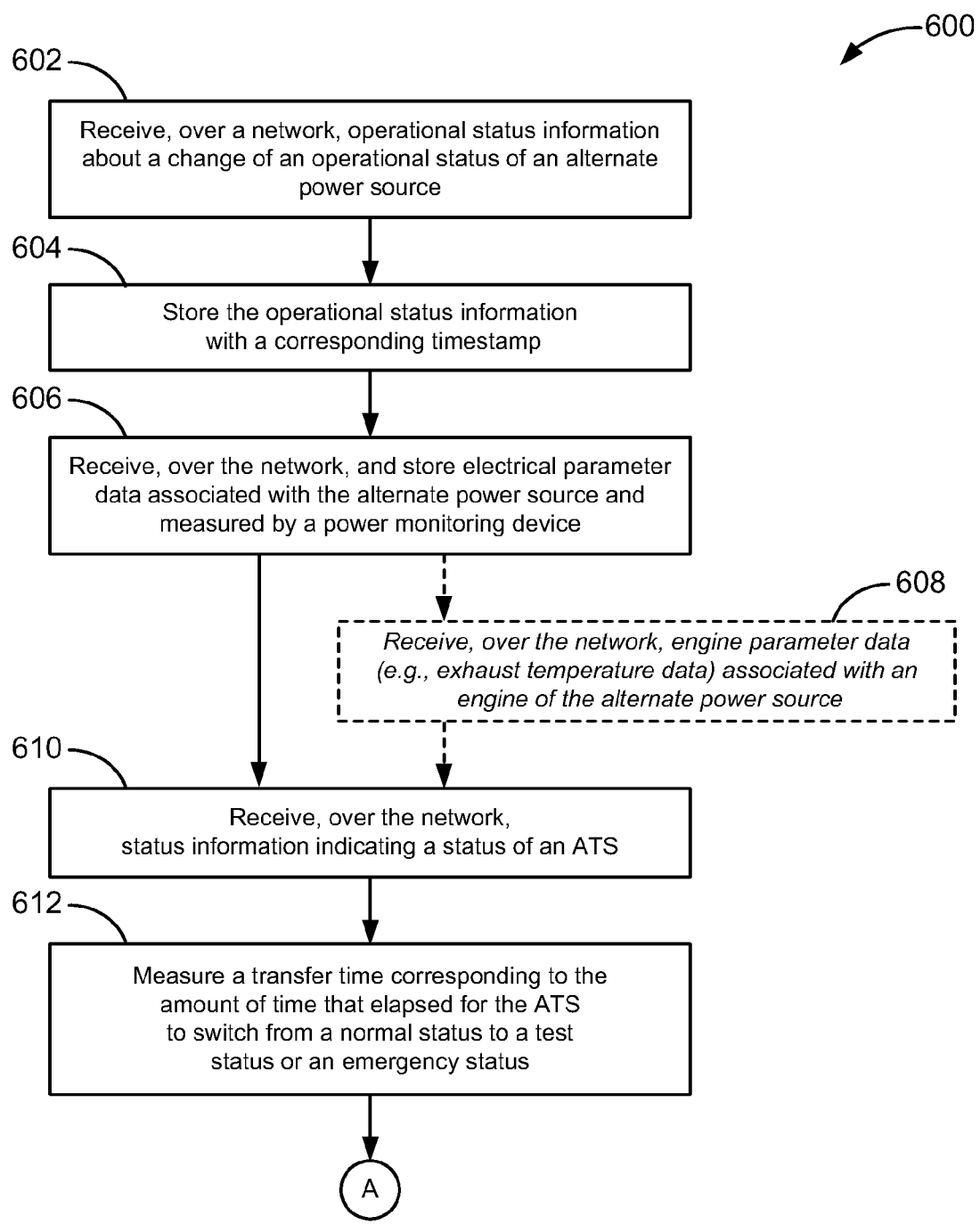
FIGS. 6A-6B are a flowchart diagram of an EPSS testing algorithm that allows the user to associate different priority levels with different transfer times for the EPSS test.
Figure 6B:
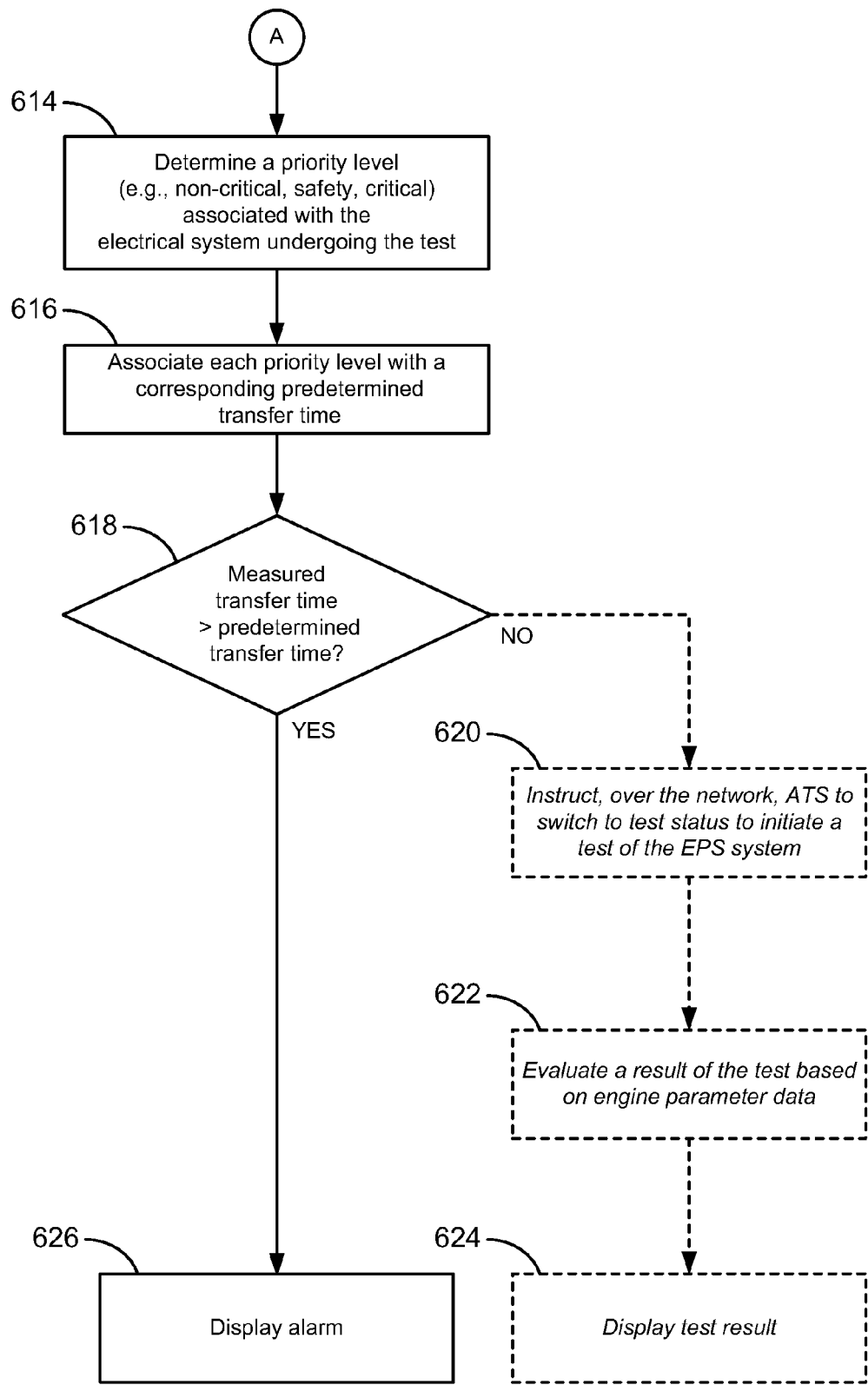

FIG. 6 illustrates a flow diagram of an algorithm 600 that allows the user to vary the transfer time requirements as a function of different priority levels. The transfer time is a function of how much time it takes for the ATS 208 to be instructed to switch to a test status, verify that the ATS 208 has switch to the test status, to instruct the generator to switch its status from stopped to started, and for the generator 110 to report that its operational status has changed from started to running. Transfer time is a legislated test criterion, which can be specified in any applicable code, standard, or regulation mentioned herein.

The algorithm 600 receives, over a network 202, operational status information about a change of an operational status of an alternate power source 110, such as an engine-generator or genset (602). The algorithm 600 stores the operational status information with a corresponding timestamp indicating when the change of the operational status occurred (604). The algorithm 600 receives, over the network 202, and stores electrical parameter data associated with the alternate power source 110 and measured by an intelligent electronic device 212, 308 that measures a characteristic of power generated by the alternate power source 110 and that transforms the measured characteristic into the electrical parameter data for communication over the network 202 (606). Optionally, the algorithm 600 can receive, over the network 202, engine parameter data associated with the alternate power source 110 (608). The engine parameter data can include exhaust temperature data indicative of an exhaust temperature of the engine of the genset 110.

The algorithm 600 receives, over the network 202, status information indicating a status of an ATS 208 configured to switch power between the main utility power source 102 and the alternate power source 110 (610). The algorithm 600 measures a transfer time that includes the amount of time that elapsed for the ATS 208 to switch from a normal status to a test status or an emergency status (612). The transfer time can further include the amount of time that elapsed for the genset 110 to report to the monitoring device 212, 308 that its status is running.

The algorithm 600 determines a priority level from among different priority levels associated with the electrical system 100 undergoing the test of the EPSS (614). The algorithm 600 associates each of the different priority levels with different predetermined transfer times (616). The algorithm 600 determines whether the measured transfer time exceeded the predetermined transfer time associated with the determined priority level (618). If so, the algorithm 600 displays an alarm indicating that the measured transfer time exceeds the predetermined transfer time (626). Optionally, if the algorithm 600 received engine parameter data at block 608, the algorithm 600 can further instruct, over the network 202, the ATS 208 to switch to a test status and initiate a test of the EPSS (620), evaluate a result of the test based on the received engine parameter data (622), and display the test result outcome (e.g., pass or fail) (624).

The different priority levels can include a low priority level associated with non-critical electrical equipment in a hospital powered by the electrical system 100, a medium priority level associated with safety electrical equipment in the hospital, and a high priority level associated with critical electrical equipment in the hospital.

Figure 7:
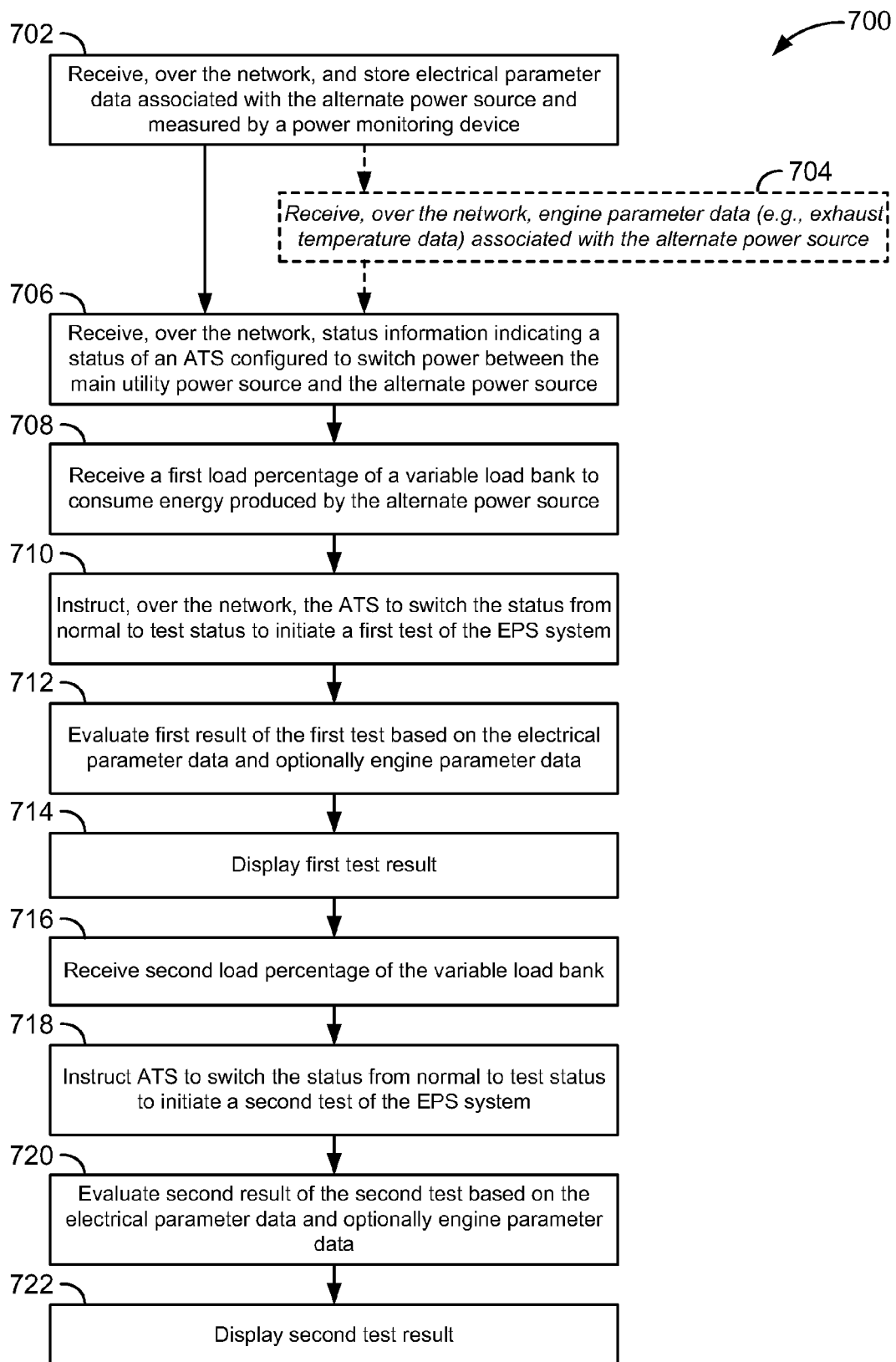
FIG. 7 is a flowchart diagram of an EPSS testing algorithm that uses variable load banks during an EPSS test.

FIG. 7 illustrates a flow diagram of an algorithm 700 that allows the user to test the EPSS using variable load bank stages. The algorithm receives, over the network 202, and stores electrical parameter data associated with the alternate power source 110 and measured by an intelligent electronic device 212, 308 that measures a characteristic of power generated by the alternate power source 110 and that transforms the measured characteristic into the electrical parameter data for communication over the network 202 (702). Optionally, the algorithm 700 also receives, over the network 202, engine parameter data (e.g., exhaust temperature data) associated with the alternate power source 110 (704). The algorithm 700 receives, over the network 202, status information indicating a status of an ATS 208 configured to switch power between the main utility power source 102 and the alternate power source 110 (706). The algorithm 700 receives a first indication of a first amount of a load of a variable load bank to consume energy produced by the alternate power source 110 (e.g., expressed as a percentage of a maximum load of the variable load bank) (708).

The algorithm 700 instructs, over the network 202, the ATS 208 to switch the status from a normal status to a test status to initiate a first test of the EPSS 200 by temporarily connecting the first load amount of the variable load bank to the alternate power source 110 for a predetermined period of time (710). The algorithm 700 evaluates a first result of the first test based on at least the electrical parameter data (712) and optionally the engine parameter data. The algorithm 700 displays an indication of the first result of the first test (714) and receives a second indication of a second load amount of the load of the variable load bank (e.g., expressed as a percentage of a maximum load of the variable load bank) (716). The algorithm 700 instructs the ATS 208 to switch the status from the normal status to the test status to initiate a second test of the EPSS 200 by temporarily connecting the second load amount of the variable load bank to the alternate power source 110 (718). The algorithm 700 evaluates a second result of the second test based on at least the electrical parameter data (720) and displays an indication of the second result of the second test (722).

Figure 8:
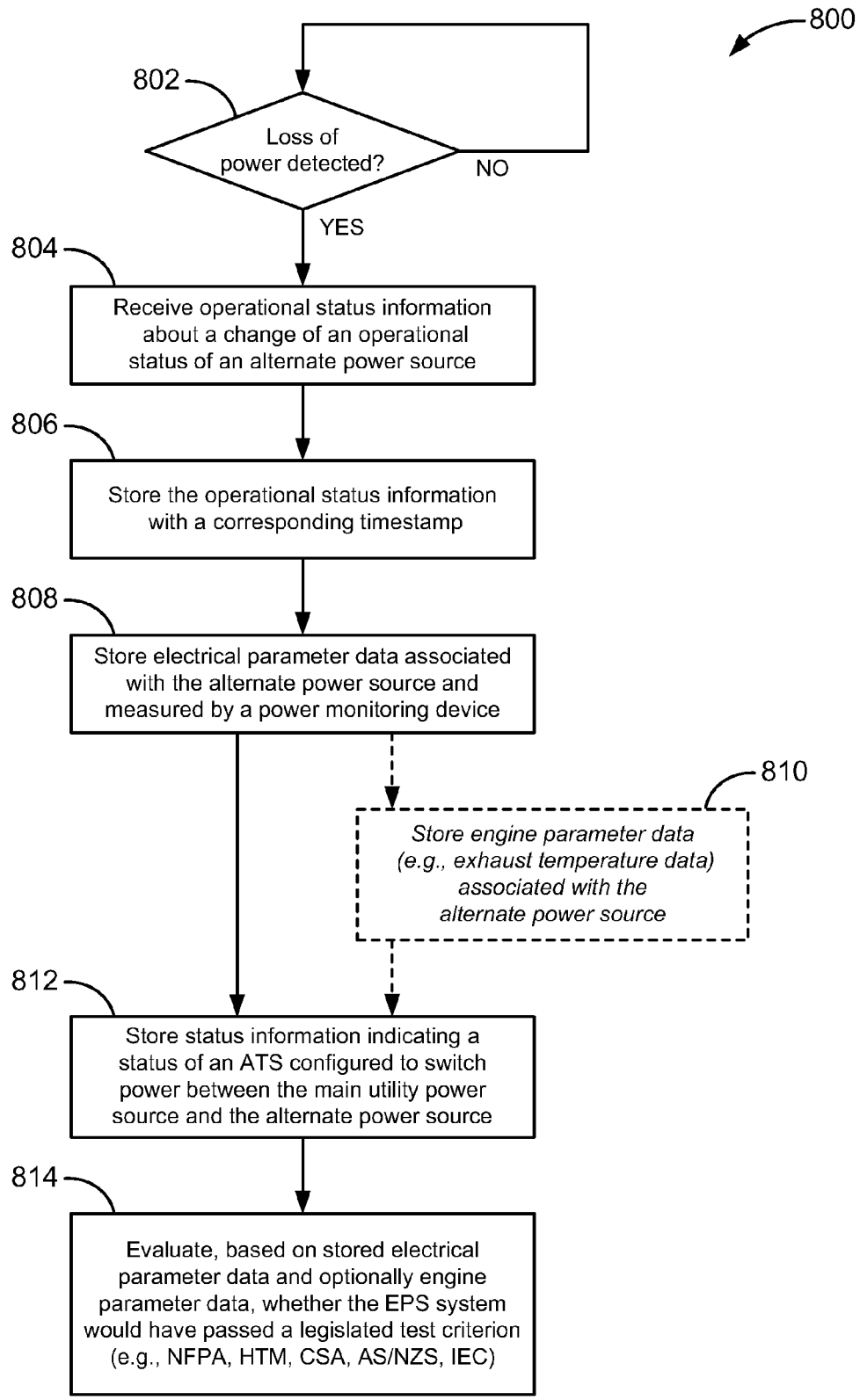
FIG. 8 is a flowchart diagram of an EPSS algorithm that stores operational parameter data during a real outage of power from a normal power source.

FIG. 8 illustrates a flow diagram of an algorithm 800 that records the same type of data recorded during an EPSS test as during a real loss of utility power 102. The algorithm 800 determines whether a loss of power from the main utility power source 102 has occurred (802). If so, the algorithm 800 receives operational status information about a change of an operational status of an alternate power source 110 (804). The algorithm 800 stores the operational status information with a corresponding timestamp indicating when the change of the operational status occurred (806) and also stores electrical parameter data associated with the alternate power source 110 and measured by an intelligent electronic device 212, 308 that measures a characteristic of power generated by the alternate power source 110 and that transforms the measured characteristic into the electrical parameter data for communication over the network 202 (808). Optionally, when the algorithm 800 receives engine parameter data, the algorithm 800 stores engine parameter data, such as exhaust temperature data indicative of the exhaust temperature of an engine of the alternate power source 110 (810). The algorithm 800 stores status information indicating a status of an ATS switch 208 configured to switch power between the main utility power source 102 and the alternate power source 110 (812). The algorithm 800 evaluates, based on the stored electrical parameter data and optionally the engine parameter data, whether the EPSS 200, 300, 300', 300" would have passed one or more legislated test criteria, which again, can be determined by a requirement set forth in a code or a standard of the National Fire Protection Association (NFPA), the Health Technical Memorandum (HTM), the Canadian Standards Association (CSA), the Australian/New Zealand Standard (AS/NZS), the International Electrotechnical Commission (IEC), or any other applicable jurisdictional or governmental body or regulatory entity. Optionally, the algorithm 800 can further communicate an alarm indicating that the EPSS 200, 300, 300', 300" would have failed the legislated test criterion, along with information about the failure (e.g., the electrical parameter data and/or engine parameter data would not have passed the corresponding legislated test criteria and the associated values that resulted in the conclusion of a failure). These alarms can be communicated, for example, by email, SMS text, via HTTP, and the like.

Figure 9A:
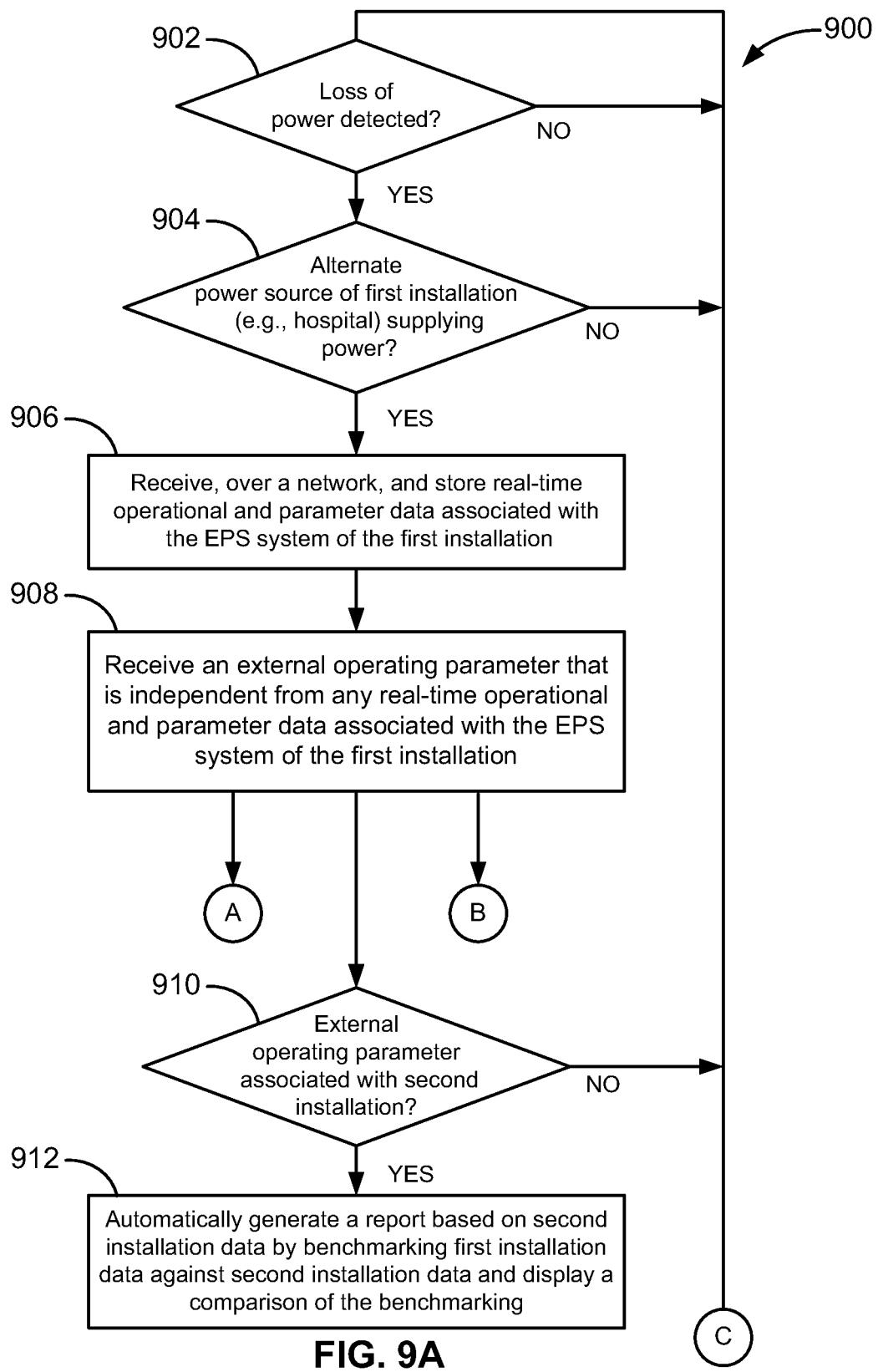
FIGS. 9A-9C are a flowchart diagram of an EPSS testing algorithm that evaluates a test based on an external operating parameter not associated with the installation on which the EPSS test is conducted.
Figure 9B:
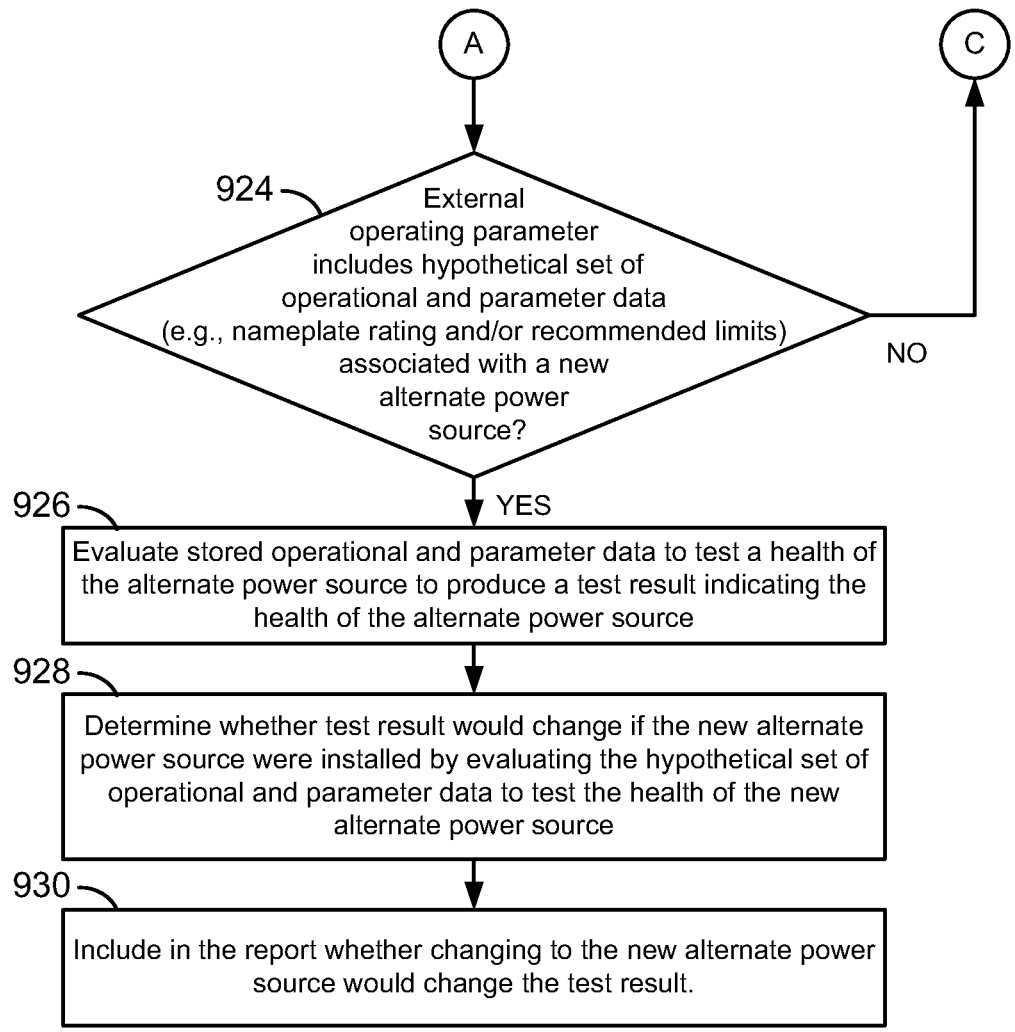
Figure 9C:
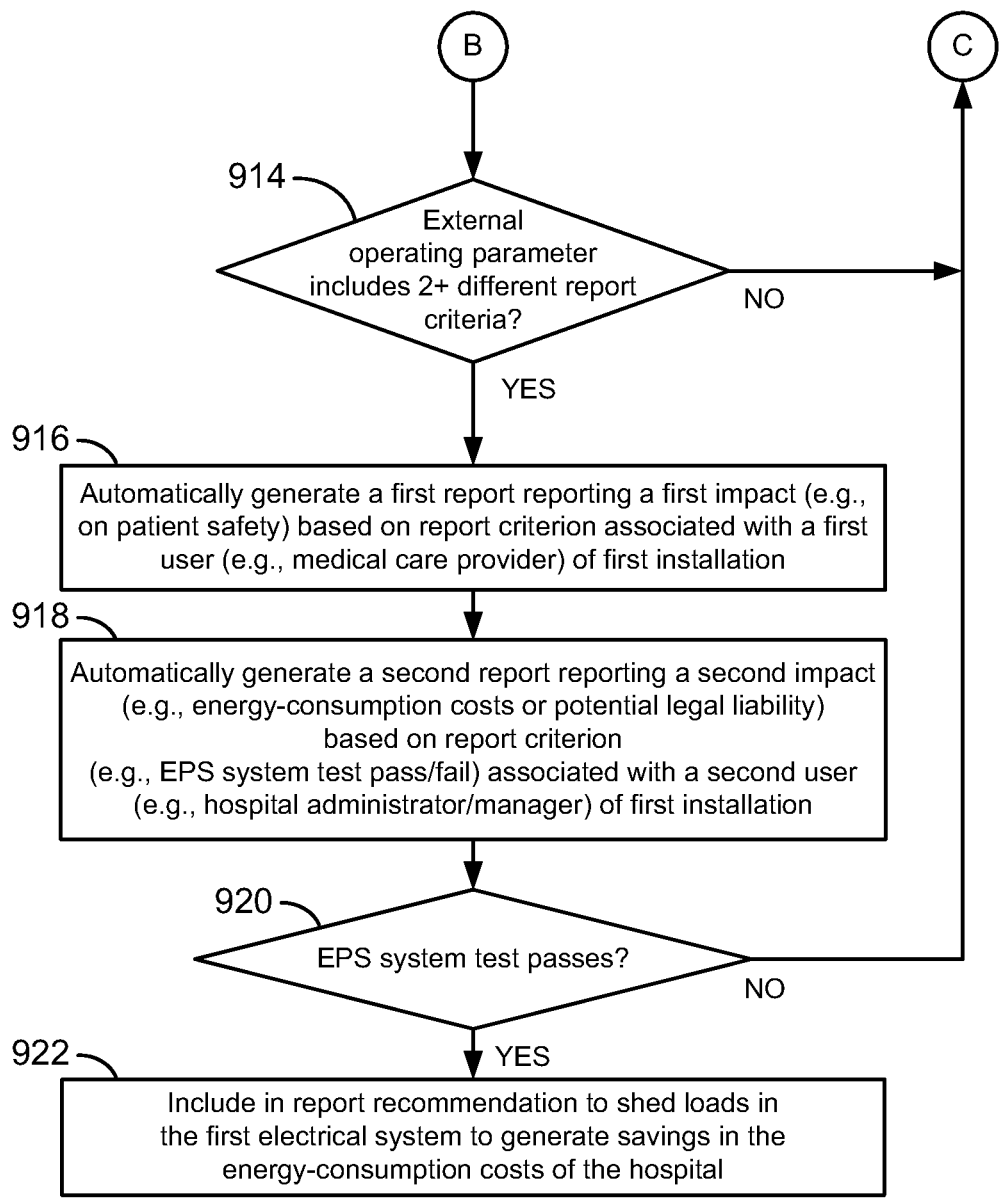

FIGS. 9A-9B illustrate a flow diagram of an algorithm 900 that automatically carries out a test of an EPS system that supplies alternate power to a first installation based on an external operating parameter, which is independent from any real-time operational and parameter data associated with the EPS system of the first installation. The algorithm 900 determines whether a loss of power from the normal power source 102 has been detected (902). If so, the algorithm 900 determines whether an alternate power source 110 of the first installation is supplying power to the electrical system of the first installation (904). FIG. 1 illustrates an electrical system 100 associated with a first installation. This algorithm 900 works with multiple installations (not shown), but each of which would represent the electrical system 100 or the EPSS 200 shown in FIGS. 1 and 2. A first installation, for example, can be a first hospital or building located in one geographic location, while a second installation can be another hospital or building located in another geographic location distinct from the geographic location of the first hospital.

The algorithm 900 receives, over a network 202, and stores real-time operational and parameter data associated with the EPS system of the first installation (906), such as the EPSS 200 shown in FIG. 2. The operational and parameter data includes (a) operational status information about a change of an operational status of the alternate power source 110 of the first installation, (b) electrical parameter data associated with the alternate power source 110 and measured by an intelligent electronic device 212, 308 that measures a characteristic of power (e.g., a waveform capture of current and/or voltage) generated by the alternate power source 110 and that transforms the measured characteristic into the electrical parameter data for communication over the network 202, and (c) status information indicating a status of an automatic transfer switch 308 configured to switch power between the main utility power source and the alternate power source 110 of the first installation.

The algorithm 900 receives an external operating parameter that is independent from any real-time operational and parameter data associated with the EPS system of the first installation (908). The algorithm 900 determines whether the external operating parameter includes operational and parameter data associated with a second EPS system of a second installation that is distinct from the first installation (910). The second installation has a second alternate power source, such as an engine-generator or genset like the alternate power source 110 shown in FIGS. 1 and 2. The operational and parameter data associated with the second installation include (a) second operational status information about a change of an operational status of the second alternate power source of the second installation, (b) second electrical parameter data associated with the second alternate power source and measured by a second IED that measures a characteristic of power generated by the second alternate power source and that transforms the measured characteristic into the second electrical parameter data for communication over a network, which can be the network 202 or another network to which the network 202 is coupled, and (c) second status information indicating a status of a second automatic transfer switch configured to switch power between the main utility power source and the second alternate power source of the second installation. The algorithm 900 automatically generates a report based on the external operating parameter by benchmarking the operational and parameter data associated with the first installation against the operational and parameter data associated with the second installation and displays a comparison of the benchmarking (912).

The algorithm 900 determines whether the external operating parameter includes two or more different report criteria associated with different users of the first installation (914). If so, the algorithm 900 automatically generates a first report reporting a first impact (e.g., patient safety) based on a report criterion associated with a first user (e.g., a medical care provider) of the first installation, such as a hospital (916). The algorithm 900 automatically generates a second report reporting a second impact (e.g., energy-consumption costs or potential legal liability) based on the report criterion associated with a second user (e.g., hospital administrator or manager) of the hospital (918). The first and second reports each report different impacts on the hospital. The algorithm 900 determines whether the EPS system passes (920) a legislated test criterion as described above. If so, the algorithm 922 includes in the report a recommendation to shed a load or loads in the first electrical system to generate savings in the energy-consumption costs of the hospital (922). If the EPS system fails, the algorithm 900 can report an impact on potential legal liability of the hospital due to a failure of the EPS system.

The algorithm 900 determines whether the external operating parameter includes a hypothetical set of operational and parameter data (e.g., nameplate rating and/or recommended limits) associated with a new alternate power source (924). If so, the algorithm 900 evaluates the stored operational and parameter data to test a health of the alternate power source to produce a test result indicating the health of the alternate power source (926). The algorithm 900 determines whether the test result would change if the new alternate power source were installed by evaluating the hypothetical set of operational and parameter data to test the health of the new alternate power source (928). The algorithm 900 includes in the report an indication as to whether changing to the new alternate power source would change the test result (930).

Figure 10:
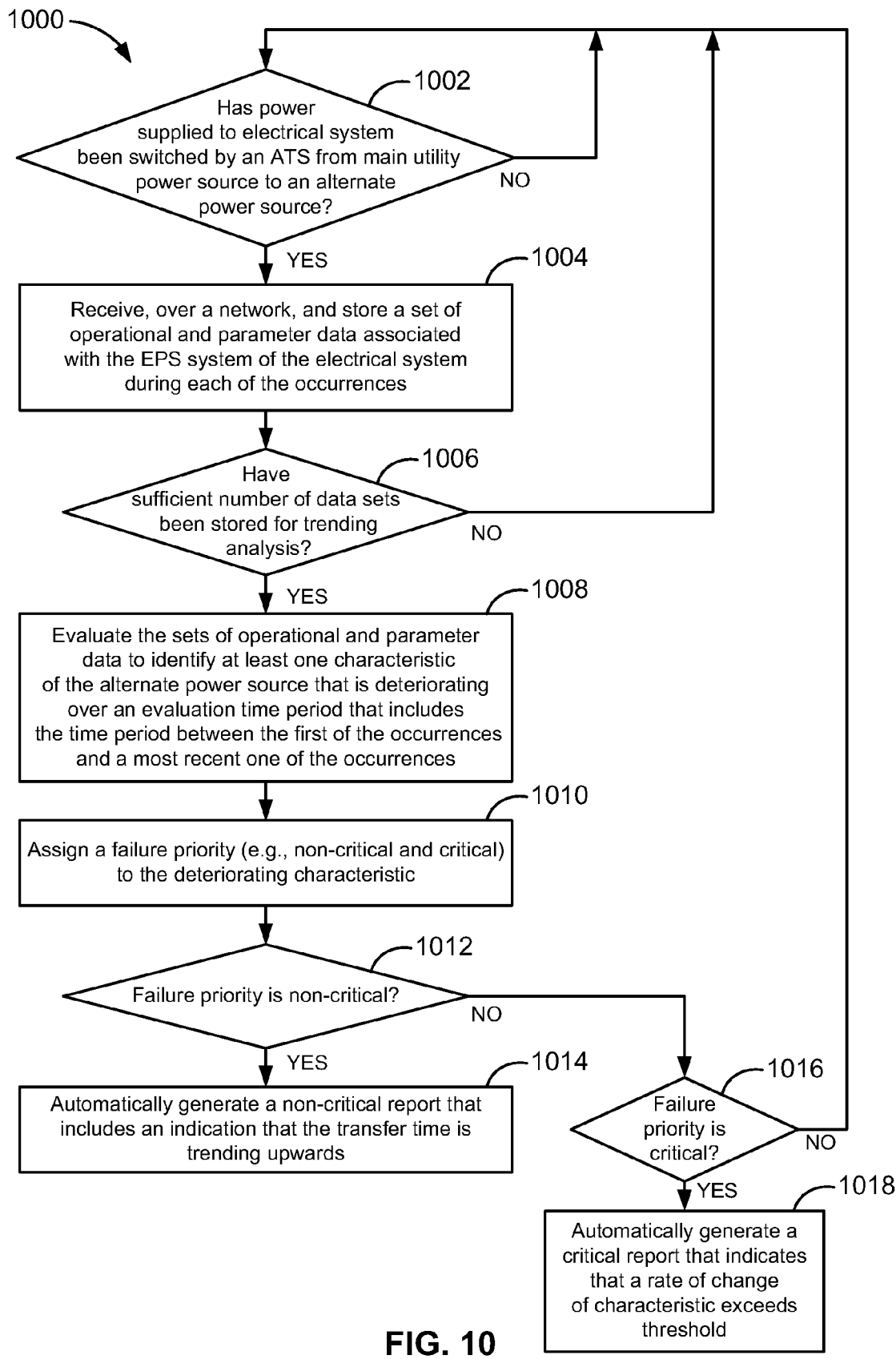
FIG. 10 is a flowchart diagram of an EPSS testing algorithm that assigns different failure priorities based on different users' needs to generate customized reports for each user.

FIG. 10 illustrates a flow diagram of an algorithm 1000 that reports the criticality of the EPSS failure. The algorithm 1000 needs to wait until multiple occurrences have occurred of the power supplied to the electrical system being switched by an ATS 208 from the main utility power source 102 to the alternate power source 110. The algorithm 1000 determines whether power supplied to the electrical system 100 has been switched by an ATS 208 from a main utility power source 102 to an alternate power source 110 (1002). If so, the algorithm 1000 receives, over a network 202, and stores (such as in the computing device 204 and/or the database 206) a set of operational and parameter data associated with the EPS system of the electrical system 100 during each of the occurrences to produce multiple sets of operational and parameter data (1004). The operational and parameter data include (a) operational status information about a change of an operational status of the alternate power source 110, (b) electrical parameter data associated with the alternate power source 110 and measured by an intelligent electronic device 212, 308 that measures a characteristic of power generated by the alternate power source 110 and that transforms the measured characteristic into the electrical parameter data for communication over the network 202, and (c) status information indicating a status of an automatic transfer switch 208 configured to switch power between the main utility power source 102 and the alternate power source 110.

The algorithm 1000 determines whether a sufficient number of data sets (at least two) have been stored for trending analysis (1006). If so, the algorithm 1000 evaluates the sets of operational and parameter data to identify at least one characteristic of the alternate power source that is deteriorating over an evaluation time period that includes the time period between the first switching occurrence and a most recent switching occurrence (1008). The algorithm 1000 assigns a failure priority (e.g., non-critical or critical) to the deteriorating characteristic (1010). The algorithm 1000 determines whether the assigned priority is non-critical (1012). If so, the algorithm 1000 automatically generates a non-critical report that indicates the failure priority (e.g., non-critical) and the deteriorating characteristic (e.g., that the transfer time is trending upwards over an evaluation period) (1014). The algorithm 1000 determines whether the assigned failure priority is critical (1016). If so, the algorithm 1000 automatically generates a critical report that indicates that a rate of change of the characteristic exceeds a threshold (1018).

The characteristic can include a transfer time representing a time period that elapses between a start time when an instruction (such as from the computing device 204) communicated to the automatic transfer switch 208 and an end time when the automatic transfer switch 208 switches power from the main utility power source 102 to the alternate power source 110. The algorithm 1000 can evaluate whether the transfer time is deteriorating over time by trending upwards or whether a rate of change of the characteristic over the evaluation time period exceeds a predetermined value such that the deterioration of the characteristic appears to spike over the evaluation time period. A sudden spike in the electrical parameter data (e.g., the load percentage or the engine exhaust temperature) can reveal a critical problem with the EPSS, warranting immediate attention, whereas a transfer time that is slowly trending upwards is not as critical, but should require attention soon.

Figure 11A:
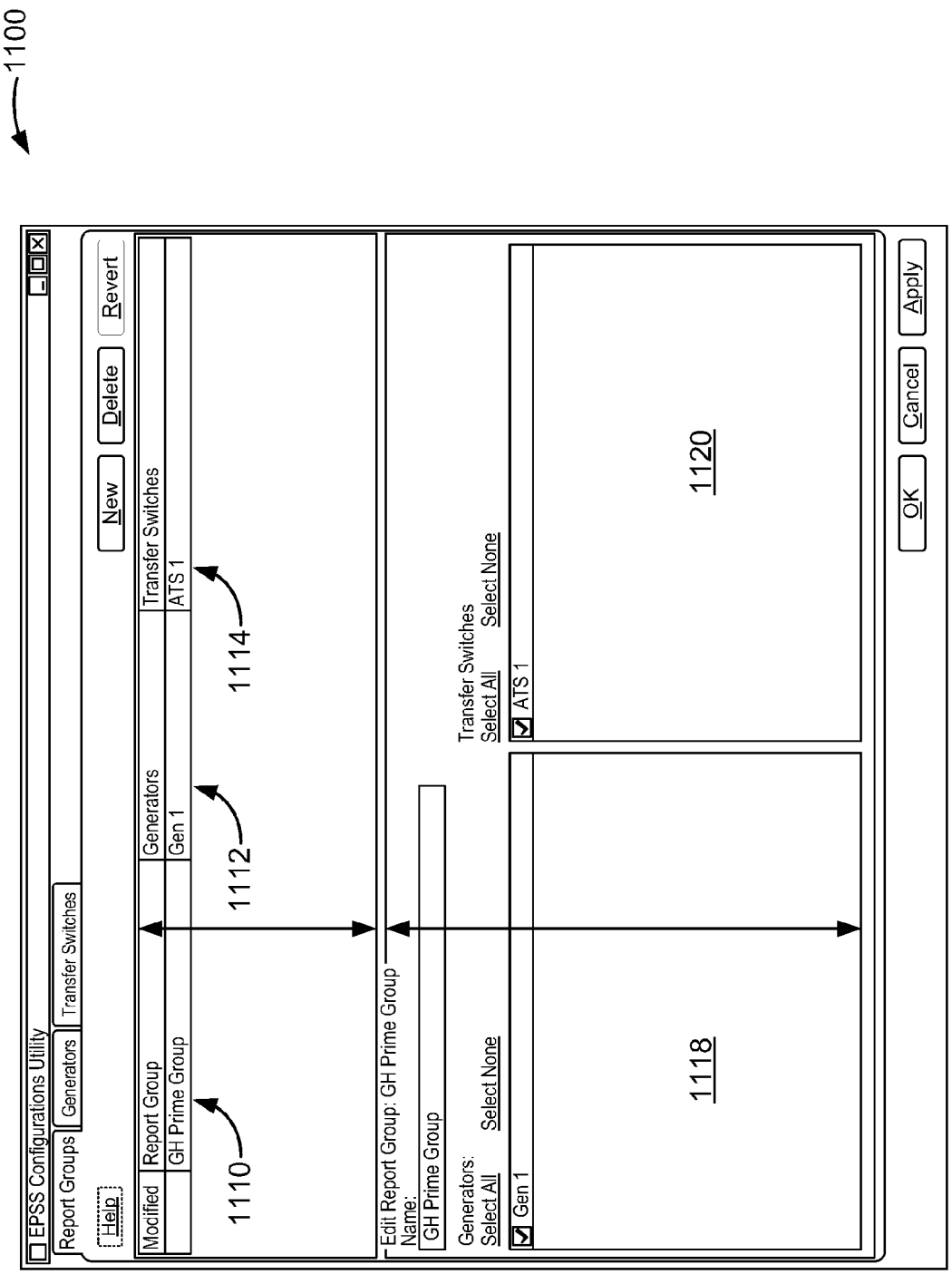
FIG. 11A is an example display of an EPSS configuration tool for configuring the EPSS report, generators, and transfer switches.
Figure 11B:
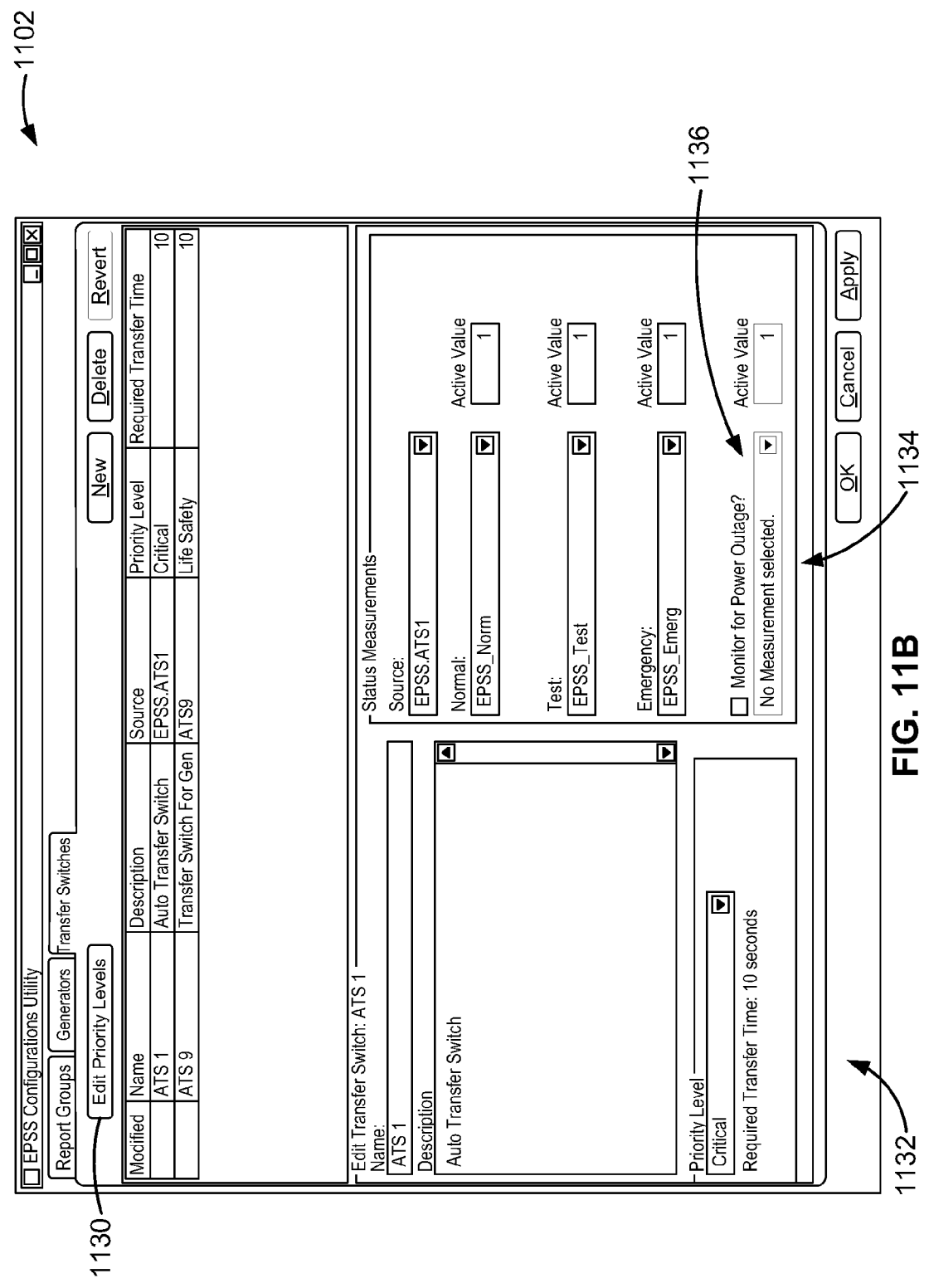
Figure 11C:
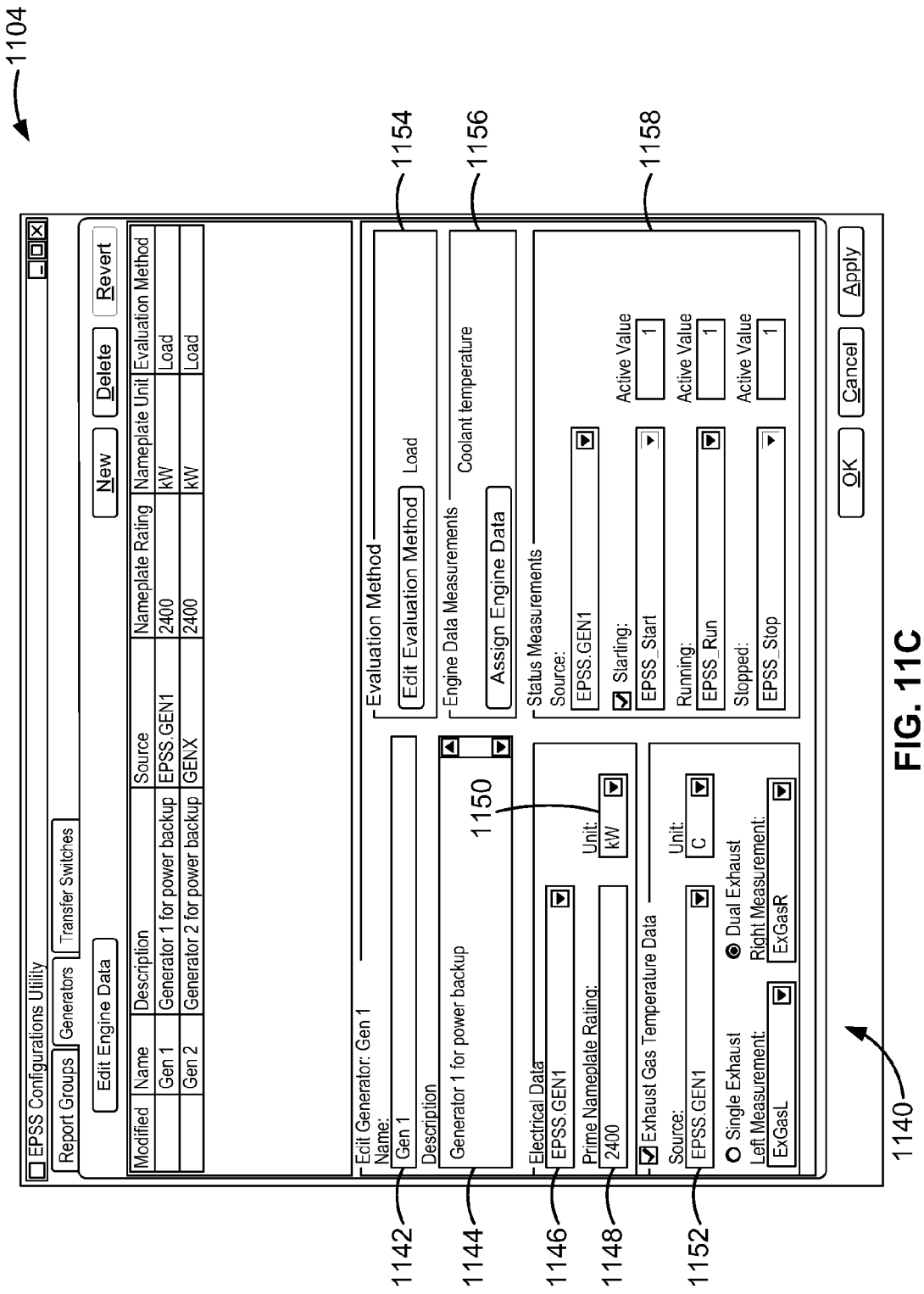
FIG. 11C is an example display for configuring one or more generators used in an EPSS test as alternate power sources.

FIGS. 11A-11C illustrate exemplary screen shots 1100, 1102, 1104 of a display on the computing device 204 for configuring the EPSS 200 for conducting the automatic testing solutions disclosed herein. In this utility, the user of the computing device 204 can create a report group 1110 that is associated with a generator 1112, such as the genset 110, and at least one ATS 1114, such as the ATS 208. The user can label each generator and ATS in this configuration utility. The user inputs a report group name in the report group name input area 1116, selects one or more generators to associate with the inputted report group in the generator selection area 1118, and selects one or more ATS switches to associate with the inputted report group in the ATS switch selection area 1120.

In FIG. 11B, the user of the computing device 204 can configure the transfer switches in the EPSS 200, 300, 300', 300". The user of the computing device 204 can configure a priority level by clicking on the priority level selection button 1130, which allows the user to associate different priority levels with different transfer times, such as described above in connection with the algorithm 600. The priority levels can be assigned in the ATS switch configuration area 1132 described below. As shown in FIG. 11B, the user can configure the name of the ATS switch 208, a description of the ATS switch 208, a source of the ATS switch 208, the assigned priority level associated with the ATS switch 208 (e.g., critical or life safety), and a required transfer time as indicated by a legislated test criterion. In this example, the required transfer time is ten seconds. In the ATS switch configuration area 1132, the user can configure the unique name of the ATS switch 208, its description, priority level (in this example, the priority level is assigned as critical), and the required transfer time.

In the status measurements area 1134 of this transfer switch configuration screen 1102, the user can select the source (e.g., a monitoring device 308) where the ATS switch 208 status information and parameter data are recorded. For each ATS status (e.g., normal, test, and emergency), the user can select the digital input on the monitoring device that will receive information indicative of each ATS status. The user can also select in a power outage monitoring selection area 1134 whether the selected ATS should monitor for a power outage of the normal power source 102. As disclosed above, the EPSS testing solutions herein can also capture electrical and engine parameter data during a real loss of power from the normal power source 102. When this option is selected, the EPSS 200 can also record, during a real loss of power, the same electrical and engine parameter data that would be recorded during a test of the EPSS 200.

In FIG. 11C, the user of the computing device 204 can configure the generators 110 in the EPSS 200, 300, 300', 300". In a generator editing area 1140, the user can input a unique name for the generator being configured 1142, a text description of that generator 1144, a source of the electrical parameter data received from the generator 1146, a maximum power load specified on the generator's nameplate rating 1148, the units (e.g., kW or kVA) of the nameplate rating 1150, and the source where the exhaust temperature data is recorded 1152, such as the address associated with the monitoring device 212. In an evaluation method selection area 1154, the user can input the desired evaluation method, which here can be load (percentage) only, exhaust temperature only, or both load percentage AND exhaust temperature, or load percentage OR exhaust temperature. In this example, the user has selected to use load only as the evaluation method for the EPSS test. The capitalized AND and OR indicate logical operators. In an engine measurement selection area 1156, the user can assign engine data to be recorded, such as coolant temperature of the engine of the genset 110, for example. In a status measurements selection area 1158, for each source of the data (e.g., status information) for the selected generator, the user inputs the digital inputs of the monitoring device 212 that receive the corresponding status inputs from the genset 110, such as the input that receives an indication that the genset 110 is starting, running, or stopped.

Figure 12A:
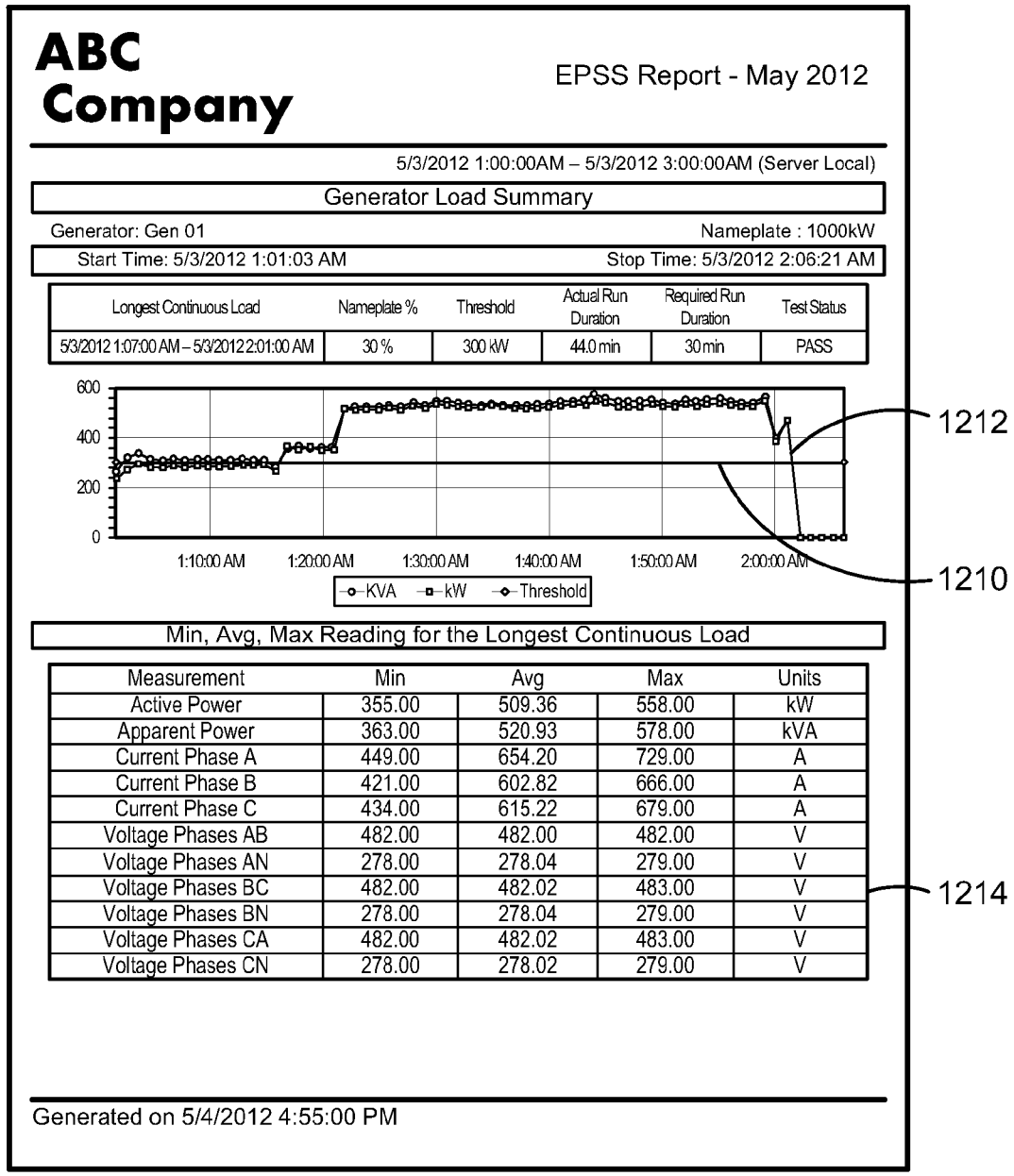
FIG. 12A is an example report showing a test result that includes a plot of load values compared to the engine's nameplate rating threshold.
Figure 12B:
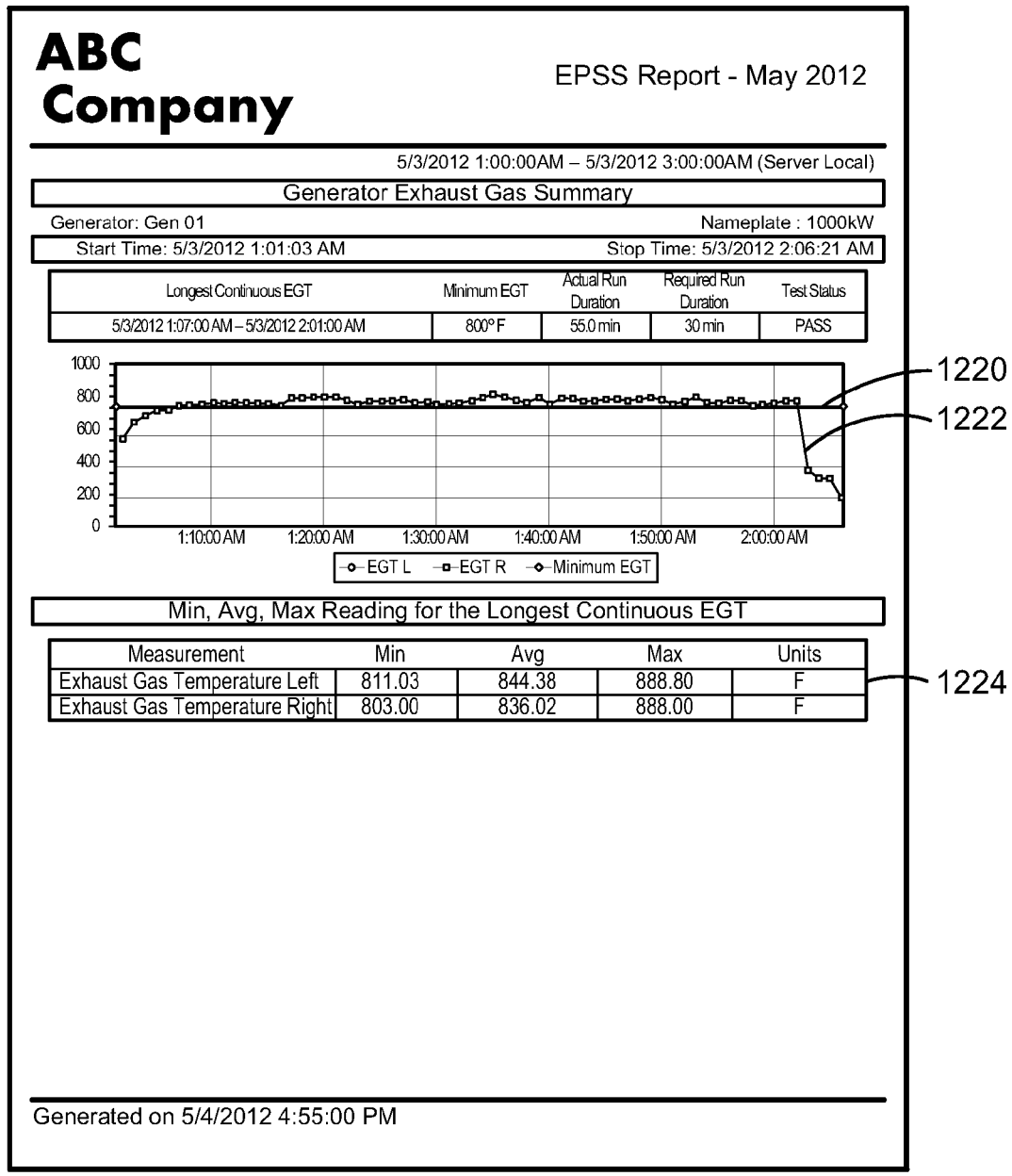
FIG. 12B is an example report showing a test result that includes a plot of exhaust temperature values compared to a minimum exhaust temperature threshold specified by a manufacturer of the engine.

FIGS. 12A and 12B are example reports 1200, 1202, which can be printed or displayed on a video display of the computing device 204. These reports show the results of an EPSS test carried out by any of the algorithms or methods disclosed herein. For example, FIG. 12A is an exemplary report 1200 that shows a generator load summary. The summary includes a load plot 1212 of the load values in kVA and kW over the test period, which in this example lasted 44 minutes. The load plot 1212 is compared against a threshold 1210 over the test period, and if the load values 1212 exceed the threshold 1210 over the legislated run duration period, which in this example is 30 minutes, the EPSS reports that the result of the test is a PASS. The report identifies the nameplate rating of the genset engine as 1000 kW, and that the threshold corresponds to 30% of the nameplate rating, or 300 kW in this example. As long as the measured load exceeds 300 kW over the legislated run duration, the EPSS test result is deemed to have passed. The report 1200 also includes the minimum, average, and maximum measurements for the longest continuous load for various measurements of electrical parameter data, including active power, apparent power, current on each of three phases A, B, C, and voltages across each of the phases relative to each other and neutral (N), along with the corresponding units of measurement. This report 1200 may be generated by the algorithm 500, for example, in response to the user selecting that electrical parameter data be used in block 516 or 524.

FIG. 12B is an exhaust temperature summary report 1202 showing a plot 1202 of exhaust temperature values plotted across an EPSS test period and measured against a threshold 1222 or minimum exhaust gas temperature (EGT), which in this example is 800° F. In this example, the legislated test criteria specify that the EPSS test must continuously record exhaust gas temperatures that exceed 800° F. for at least 30 minutes. In this example, the engine in the alternate power source features dual exhausts (a left and a right one), so the temperature of both exhausts are measured by corresponding temperature sensors, such as the temperature sensor 214 (a second temperature sensor would record the temperature produced by the other exhaust). The report 1202 includes a table showing the minimum, average, and maximum exhaust temperature readings (for both left and right exhausts) over the test period, which in this example was 55 minutes. The report 1202 indicates that the EPSS test result is a PASS because the exhaust temperatures exceeded the minimum exhaust gas temperature threshold for at least 30 minutes, the legislated test time duration. This report 1202 may be generated by the algorithm 400 or the algorithm 500, for example, in response to the user selecting that engine parameter data be used in block 520 or 524.

Although the algorithms described with reference to the foregoing flow charts have been described separately, it should be understood that any two or more of the algorithms 400-1000 disclosed herein can be combined in any combination. For example, the algorithms 400 and 800 and optionally 900 can be combined together, or the algorithms 500 and 800 and optionally 900 can be combined together, or the algorithms 600 and 800 and optionally 900 can be combined together, or the algorithms 700 and 800 and optionally 900 can be combined together, or the algorithms 1000 and 800 and optionally 900 can be combined together, etc. The present disclosure explicitly contemplates any other combination of two or more of the algorithms 400-1000.

Any of the methods described herein can include machine readable instructions for execution by: (a) a processor, (b) a controller, and/or (c) any other suitable processing device. It will be readily understood that the IEDs 120a-e, the server 110, and/or the computer 140 can include such a suitable processing device. Any algorithm, software, or method disclosed herein can be embodied in software stored on a non-transitory tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

It should be noted that the algorithms illustrated and discussed herein as having various modules which perform particular functions and interact with one another. It should be understood that these modules are merely segregated based on their function for the sake of description and represent computer hardware and/or executable software code which is stored on a computer-readable medium for execution on appropriate computing hardware. The various functions of the different modules and units can be combined or segregated as hardware and/or software stored on a non-transitory computer-readable medium as above as modules in any manner, and can be used separately or in combination.

Hospital CEOs, administrators and executive management are most concerned about reliability, traceability, and liability, and emergency power supply systems can appropriately manage these concerns. Unfortunately, the reliability of the diesel generators commonly used for backup power can be compromised if they are operated outside of their intended operating range, and consequently, may fail to operate or start when needed in case of a utility power failure. To avoid an EPSS failure, diesel engines used for emergency backup power in hospitals should be tested and exercised at regular intervals within the parameters dictated by regulatory bodies and engine manufacturers. However traditional manual test procedures have been shown to be error prone, time-consuming and inefficient from a staffing perspective. By installing an electronic system that continuously monitors and records EPSS-related parameters, it is easy to prove regulatory compliance, and have precise electronic records available for traceability and troubleshooting in case of an unanticipated failure. In addition, electronic records can be used for long-term EPSS trend analysis. Subtle long-term trends in parameters such as ATS transfer-times, differential fuel pressure, engine-start battery voltage, etc. can be used as flags for required maintenance.

Automated testing and monitoring helps point out problems during testing rather than during an outage. As such, the system's overall mean time between failures (MTBF) can be improved, giving patients, staff and administrators peace of mind, so they can rest assured that the EPS system is ready to power the hospital whenever required.

Any of the EPSS reports herein can be combined with the patient's digital medical records such that a full understanding can be obtained on the electrical infrastructure and on the events that occurred while a patient was in care. For example, if a patient relies on a ventilator, an EPSS test report generated herein can verify that no impact on the operation of the ventilator occurred on that patient during testing of the EPSS. This information can be helpful in avoiding potential liability issues, for example.

While particular aspects, embodiments, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the invention as defined in the appended claims.

What is claimed is:

1. A method for automatically testing an emergency power supply system (EPSS) that supplies alternate power to an electrical system in an event of a disruption of power from a main utility power source that normally supplies power to the electrical system, the method comprising:
receiving, over a network, engine parameter data associated with an alternate power source, the engine parameter data including exhaust temperature data indicative of an exhaust temperature of an engine, the alternate power source configured to supply alternate power to the electrical system in the event of a disruption of power from the main utility power source that normally supplies power to the electrical system;
instructing, over the network, an automatic transfer switch to switch a status from a normal status to a test status to initiate a test of the emergency power supply system by temporarily disconnecting the electrical system from the main utility power source and connecting the electrical system to the alternate power source for a predetermined period of time; evaluating a result of the test based on at least the engine parameter data; and
responsive to the evaluating, displaying an indication of an outcome of the result of the test.

2. The method of claim 1, further comprising:
receiving, over the network, operational status information about a change of an operational status of the alternate power source including the engine, the engine having a nameplate rating;
storing the operational status information with a corresponding timestamp indicating when the change of the operational status occurred;

receiving, over the network, status information indicating a status of the automatic transfer switch configured to switch power between the main utility power source and the alternate power source;

wherein the evaluating the result is further based on the operational status information and the status information, and wherein the outcome includes a pass or a fail.

3. The method of claim 1, wherein the exhaust temperature data includes a plurality of exhaust temperature values measured by a temperature sensor during the test, and wherein the result includes the plurality of exhaust temperature values, and wherein the evaluating includes determining whether the exhaust temperature values exceed a minimum temperature during at least part of the predetermined period of time of the test.

4. The method of claim 3, wherein the operational status includes a running status indicating that the engine is running, a started status indicating that the engine is started, or a stopped status indicating that the engine is stopped, and wherein the status of the ATS includes the test status, the normal status in which the main utility power source supplies power to the electrical system, or an emergency status in which the alternate power source supplies power to the electrical system.

5. The method of claim 4, wherein the evaluating the result includes determining whether the operational status information corresponds to the running status during the predetermined period of time, whether the operational status information corresponds to the test status indicating that the alternate power source supplied power to the electrical system during the predetermined period of time.

6. The method of claim 1, further comprising: receiving, over the network, and storing electrical parameter data associated with the alternate power source and measured by an intelligent electronic device that measures a characteristic of power generated by the alternate power source and that transforms the measured characteristic into the electrical parameter data for communication over the network;

wherein the evaluating the result is further based on the stored electrical parameter data.

7. The method of claim 6, wherein the evaluating is further based on a load percentage of the nameplate rating, the load percentage being calculated from the electrical parameter data during the test, wherein the result includes a plurality of load percentage values calculated from the electrical parameter data during the predetermined period of time, the evaluating including determining whether the plurality of load percentage values exceed a predetermined load percentage value of the nameplate rating during at least part of the predetermined period of time.

8. The method of claim 1, wherein the engine parameter data further includes any one or more of a battery voltage of a battery in the alternate power source, a coolant temperature or pressure of the engine, or a differential pressure across a fuel filter of the engine, and wherein the alternate power source is an engine-generator (genset).

9. The method of claim 1, further comprising: responsive to an occurrence of a loss of power from the main utility power source: storing second electrical parameter data associated with the alternate power source and measured by an intelligent electronic device; and evaluating, based on at least the stored second electrical parameter data during the loss of power from the main utility power source, whether the EPSS would have passed at least one legislated test criterion associated with a test of the EPSS.

10. The method of claim 9, wherein the evaluating whether the EPSS would have passed at least one legislated test criterion includes determining whether a plurality of load percentage values in the second electrical parameter data exceed the predetermined load percentage value of a nameplate rating during at least part of the predetermined period of time.

11. The method of claim 9, wherein the legislated test criterion is determined by a requirement set forth in a code or a standard of the National Fire Protection Association (NFPA), the Health Technical Memorandum (HTM), the Canadian Standards Association (CSA), the Australian/New Zealand Standard (AS/NZS), or the International Electrotechnical Commission (IEC).

12. The method of claim 9, further comprising, responsive to the occurrence of the loss of power, storing second engine parameter data associated with the alternate power source, wherein the second engine parameter data includes any one or more of an exhaust temperature of the engine, a battery voltage of a battery in the alternate power source, a coolant temperature or pressure of the engine, a differential pressure across a fuel filter of the engine, or a waveform associated with an output of the engine, and wherein the evaluating whether the EPSS would have passed the legislated test criterion is further based on the second engine parameter data.

13. The method of claim 9, further comprising, responsive to the occurrence of the loss of power, storing second engine parameter data associated with the engine, wherein the second engine parameter data includes an exhaust temperature of the engine, and wherein the evaluating whether the emergency power supply system would have passed the legislated test criterion is further based on the second engine parameter data.

14. The method of claim 9, further comprising, responsive to the evaluating determining that the emergency power supply system would have failed the legislated test criterion, communicating an alarm indicating that the emergency power supply system would have failed the legislated test criterion and at least one parameter associated with the legislated test criterion that caused the EPSS to fail the legislated test criterion associated with the test of the EPSS.

15. The method of claim 1, wherein the electrical system is a first electrical system of a first installation, the method further comprising: responsive to the alternate power source of the first installation supplying power to the first electrical system, receiving, over the network, and storing real-time operational and parameter data associated with the EPS system of the first installation, the operational and parameter data including electrical parameter data associated with the alternate power source and measured by an intelligent electronic device that measures a characteristic of power generated by the alternate power source and that transforms the measured characteristic into the electrical parameter data for communication over the network;

receiving an external operating parameter that is independent from any real-time operational and parameter data associated with the EPS system of the first installation; automatically generating a report based on at least the external operating parameter.

16. The method of claim 15, wherein the external operating parameter includes operational and parameter data associated with a second EPS system of a second installation that is distinct from the first installation, the second installation having a second alternate power source, the operational and parameter data associated with the second installation including second electrical parameter data associated with the second alternate power source and measured by a second intelligent electronic device that measures a characteristic of power generated by the second alternate power source and that transforms the measured characteristic into the second electrical parameter data for communication over the network, wherein the automatically generating the report includes benchmarking the operational and parameter data associated with the first installation against the operational and parameter data associated with the second installation, the method further including displaying a comparison of the benchmarking.

17. The method of claim 15, wherein the external operating parameter includes at least two different report criteria associated with different users of the first installation, wherein the automatically generating the report includes: automatically generating a first report based on the report criterion associated with a first of the users of the first installation; and
automatically generating a second report based on the report criterion associated with a second of the users of the first installation, the first report and the second report reporting different impacts on the first installation.

18. The method of claim 17, wherein: the first installation is a hospital, the first user includes a medical care provider, the impact reported by the first report includes an impact on patient safety, the second user includes an administrator or manager of the hospital other than the medical care provider, the impact reported by the second report includes an impact on energy-consumption costs responsive to a passing of the EPS system.

19. The method of claim 18, wherein responsive to the passing of the EPS system, the report further includes a recommendation to shed a load or loads in the first electrical system to generate savings in the energy-consumption costs of the hospital.

20. The method of claim 18, wherein the impact reported by the second report includes an impact on potential legal liability of the hospital responsive to a failure of the EPS system.

21. The method of claim 15, wherein the external operating parameter includes a hypothetical set of operational and parameter data associated with a new alternate power source, the method further comprising: evaluating the stored operational and parameter data to test a health of the alternate power source to produce a test result indicating the health of the alternate power source;
determining whether the test result would change if the new alternate power source were installed by evaluating the hypothetical set of operational and parameter data to test the health of the new alternate power source; and
including in the report an indication as to whether changing to the new alternate power source would change the test result.

22. The method of claim 21, wherein the hypothetical set of operational and parameter data includes a nameplate rating of the new alternate power source and recommended limits specified by a manufacturer of the new alternate power source.

23. The method of claim 1, wherein the evaluating the result of the test includes determining, responsive to the instructing, a transfer time associated with switching the power from the main utility power source to the alternate power source based on the received operational status information and the received status information.

24. The method of claim 1 performed by a computing device according to instructions encoded in a computer program stored on a non-transitory tangible medium.

25. A system for automatically testing an emergency power supply system (EPSS) that supplies alternate power to an electrical system in an event of a disruption of power from a main utility power source that normally supplies power to the electrical system, the system comprising: an alternate power source having an engine and configured to supply alternate power to the electrical system in the event of a disruption of power from the main utility power source that normally supplies power to the electrical system;
a network;
a sensor positioned to sense an exhaust temperature of an engine;
an automatic transfer switch operable to disconnect the electrical system from the main utility power source and to connect the electrical system to the alternate power source; and
a computing device communicatively coupled to the network and configured to: receive engine parameter data indicative of the exhaust temperature over the network;
instruct, over the network, the automatic transfer switch to switch the status from a normal status to a test status to initiate a test of the emergency power supply system by temporarily disconnecting the electrical system from the main utility power source and connecting the electrical system to the alternate power source for a predetermined period of time;
and evaluate a result of the test based on the engine parameter data and display an indication of an outcome of the result of the test.

26. The system of claim 25, further comprising: an intelligent electronic device that measures a characteristic of power generated by the alternate power source and that transforms the measured characteristic into corresponding electrical parameter data for communication over the network, wherein the computing device is further configured to: receive the electrical parameter data over the network, receive, over the network, status information indicating a status of the automatic transfer switch, and calculate a load percentage of a nameplate rating of the engine from the electrical parameter data during the test, wherein the result of the test is evaluated based on a load percentage, wherein the outcome includes a pass or a fail.

27. A computer program product, comprising one or more non-transitory tangible media having a computer readable program logic embodied therein, the computer readable program logic configured to be executed to implement a method for automatically testing an emergency power supply system (EPSS) that supplies alternate power to an electrical system in the event of a disruption of power from a main utility power source that normally supplies power to the electrical system, the method comprising: receiving, over a network, engine parameter data associated with an alternate power source, the engine parameter data including exhaust temperature data indicative of an exhaust temperature of an engine, the alternate power source configured to supply alternate power to the electrical system in the event of a disruption of power from the main utility power source that normally supplies power to the electrical system;
instructing, over the network, an automatic transfer switch to switch a status from a normal status to a test status to initiate a test of the emergency power supply system by temporarily disconnecting the electrical system from the main utility power source and connecting the electrical system to the alternate power source for a predetermined period of time; evaluating a result of the test based on at least the engine parameter data; and responsive to the evaluating, displaying an indication of an outcome of the result of the test.

* * * * *